United States Patent
Oshita et al.

(10) Patent No.: US 11,053,339 B2
(45) Date of Patent: Jul. 6, 2021

(54) POLYURETHANE FOR POLISHING LAYER, POLISHING LAYER INCLUDING POLYURETHANE AND MODIFICATION METHOD OF THE POLISHING LAYER, POLISHING PAD, AND POLISHING METHOD

(71) Applicant: KURARAY CO., LTD., Kurashiki (JP)

(72) Inventors: Azusa Oshita, Kurashiki (JP); Minori Takegoshi, Kurashiki (JP); Mitsuru Kato, Kurashiki (JP); Chihiro Okamoto, Kurashiki (JP); Shinya Kato, Chiyoda-ku (JP)

(73) Assignee: KURARAY CO., LTD., Kurashiki (JP)

( * ) Notice: Subject to any disclaimer, the term of this patent is extended or adjusted under 35 U.S.C. 154(b) by 0 days.

(21) Appl. No.: 16/608,050

(22) PCT Filed: Apr. 27, 2018

(86) PCT No.: PCT/JP2018/017200
§ 371 (c)(1),
(2) Date: Oct. 24, 2019

(87) PCT Pub. No.: WO2018/207670
PCT Pub. Date: Nov. 15, 2018

(65) Prior Publication Data
US 2020/0190247 A1    Jun. 18, 2020

(30) Foreign Application Priority Data
May 12, 2017   (JP) .............................. JP2017-095378

(51) Int. Cl.
| | | |
|---|---|---|
| *C08G 18/38* | (2006.01) | |
| *B24B 37/24* | (2012.01) | |
| *C08G 18/32* | (2006.01) | |
| *C08G 18/76* | (2006.01) | |
| *H01L 21/3105* | (2006.01) | |
| *H01L 21/321* | (2006.01) | |
| *C08G 18/08* | (2006.01) | |
| *B24D 3/00* | (2006.01) | |
| *B24D 3/34* | (2006.01) | |

(52) U.S. Cl.
CPC .......... *C08G 18/3819* (2013.01); *B24B 37/24* (2013.01); *B24D 3/00* (2013.01); *B24D 3/002* (2013.01); *B24D 3/346* (2013.01); *C08G 18/0895* (2013.01); *C08G 18/3206* (2013.01); *C08G 18/7671* (2013.01); *H01L 21/31053* (2013.01); *H01L 21/3212* (2013.01)

(58) Field of Classification Search
CPC .......... B24B 37/24; B24D 3/00; B24D 3/002; B24D 3/346; B24D 3/0895; B24D 3/3206; B24D 3/3819; B24D 3/4854; B24D 3/65; B24D 3/6511; B24D 3/6607; B24D 3/6674; B24D 3/7671
See application file for complete search history.

(56) References Cited

U.S. PATENT DOCUMENTS

| | | | | |
|---|---|---|---|---|
| 4,740,531 | A * | 4/1988 | Rasshofer | C08G 18/5024 521/167 |
| 4,745,135 | A * | 5/1988 | Thomas | C08G 18/635 264/51 |
| 9,181,386 | B2 * | 11/2015 | Doura | C08G 18/2835 |
| 2004/0055223 | A1 | 3/2004 | Ono et al. | |
| 2010/0009612 | A1 | 1/2010 | Park et al. | |
| 2011/0214810 | A1 | 9/2011 | Burckhardt et al. | |
| 2011/0253309 | A1 | 10/2011 | Burckhardt | |
| 2012/0012251 | A1 | 1/2012 | Burckhardt et al. | |
| 2012/0100394 | A1 | 4/2012 | Richert et al. | |

FOREIGN PATENT DOCUMENTS

| | | |
|---|---|---|
| CN | 1336861 A | 2/2002 |
| CN | 105801799 A | 7/2016 |
| CN | 106497496 A | 3/2017 |
| GB | 1 286 246 | 8/1972 |
| JP | 2000-234010 A | 8/2000 |
| JP | 2003-48940 A | 2/2003 |
| JP | 2005-294661 A | 10/2005 |
| JP | 2006-36909 A | 2/2006 |
| JP | 2006-328288 A | 12/2006 |
| JP | 2008-24850 A | 2/2008 |
| JP | 2008-163228 A | 7/2008 |
| JP | 2011-213866 A | 10/2011 |
| JP | 2012-510503 A | 5/2012 |
| JP | 2012-510549 A | 5/2012 |

(Continued)

OTHER PUBLICATIONS

International Search Report dated Jul. 3, 2018 in PCT/JP2018/017200 filed on Apr. 27, 2018.

(Continued)

*Primary Examiner* — John M Cooney

(74) *Attorney, Agent, or Firm* — Oblon, McClelland, Maier & Neustadt, L.L.P.

(57) ABSTRACT

Disclosed herein are polyurethanes useful for polishing layers, where the polyurethane is a polyurethane having a Schiff base. Also disclosed herein are polishing layers containing the polyurethanes, polishing methods that use the polishing layers, and a modification method including a step of converting the Schiff base into at least one functional group selected from an aldehyde group, a carboxylic acid group, a hydroxyl group, and an amino group.

1 Claim, 5 Drawing Sheets

(56) References Cited

FOREIGN PATENT DOCUMENTS

| JP | 2012-516918 | A | 7/2012 |
|---|---|---|---|
| JP | 2012-522094 | A | 9/2012 |
| JP | 2013-18056 | A | 1/2013 |
| JP | 2017-2192 | A | 1/2017 |
| WO | WO 2002/043921 | A1 | 6/2002 |
| WO | WO 2008/029725 | A1 | 3/2008 |

OTHER PUBLICATIONS

Buruiana, E. C. et al., "Synthesis and properties of some new polyazomethine-urethanes," European Polymer Journal, vol. 38, 2002, pp. 1079-1086.

Kausar, A. et al., "An investigation on new high performance Schiff base polyurethanes," High Performance Polymers, vol. 24, No. 2, 2012, pp. 125-134.

Simionescu, C. I. et al., "Urethanic compounds with Schiff base structure," Material Research Innovations, vol. 4, 2001, pp. 161-165.

Kaya, I. et al., "Synthesis, optical, electrochemical, and thermal stability properties of poly(azomethine-urethane)s," Progress in Organic Coatings, vol. 74, 2012, pp. 204-214.

Raghu, A. V. et al., "Synthesis, Characterization, and Molecular Modeling Studies of Novel Polyurethanes Based on 2,2'-[Ethane-1,2-diylbis(nitrilomethylylidene)]diphenol and 2,2'-[Hexane-1,6-diylbis(nitrilomethylylidene)]diphenol Hard Segments," Journal of Polymer Science: Part A: Polymer Chemistry, vol. 44, 2006, pp. 6032-6046.

Simionescu, C. I. et al., "New azomethine-urethanic compounds," Die Angewandte Makromolekulare Chemie, vol. 238, 1996, pp. 119-127.

Natarajan Senthilkumar et al., "Novel Metal-Containing Polyurethane Elastomers Prepared Using Tetradentate Schiff Base Metal Complexes", Macromolecular Chemistry and Physics, vol. 206, No. 24, Dec. 22, 2005, pp. 2490-2500, XP055765167.

Chen L et al., "The Study of Metal-Schiff Base Coordinated Polyurethane", Polymers for Advanced Technologies, Wiley& Sons, Bognor Regis, GB, vol. 8, No. 6, Jun. 1, 1997, pp. 335-338, XP000695242.

Alfred C W Leung et al., "Schiff Base Complexes in Macromolecules", Journal of Inorganic and Organometallic Polymers. Kluwer Academic Publishers—Plenum Publishers, NE, vol. 17, No. 1, Feb. 16, 2007, pp. 57-89, XP019504466.

Partial Supplementary European Search Report dated Jan. 25, 2021 in Patent Application No. 18798868.8, 18 pages.

* cited by examiner (a)

↓ dissociation condition (b)

(a)

acid treatment (b)

hydration (c)

POLYURETHANE FOR POLISHING LAYER, POLISHING LAYER INCLUDING POLYURETHANE AND MODIFICATION METHOD OF THE POLISHING LAYER, POLISHING PAD, AND POLISHING METHOD

TECHNICAL FIELD

The present invention relates to a novel polyurethane for a polishing layer, a polishing layer including a polyurethane and a modification method of the polishing layer, a polishing pad, and a polishing method.

BACKGROUND ART

Polyurethanes are produced by reacting a raw material containing a chain extender, a polymer diol, and an organic diisocyanate. For example, PTL 1 listed below discloses a chain extender composed of an amide group-containing diol that is used as a raw material component of a polyurethane resin that can produce a thermoplastic polyurethane resin exhibiting excellent mechanical strength and having excellent thermal stability.

Meanwhile, CMP is known as a polishing method used, for example, for mirror-finishing a semiconductor wafer, or planarizing the surface of an object to be polished that includes an insulating film such as an oxide film or a conductive material film in a process of forming a circuit on a semiconductor substrate. CMP is a method in which an object to be polished is polished with high precision by using a polishing pad, while supplying a slurry containing abrasive grains and a reaction liquid onto the surface of the object to be polished. Polyurethanes are used as a material of a polishing layer of the polishing pad used for CMP.

With the recent increase in the level of integration and the number of multilayered interconnections of circuits formed on a semiconductor substrate, there is a need for an increased polishing rate and even higher flatness for CMP. To meet such a need, it has been proposed to adjust the zeta potential of the surface of a polyurethane in order to increase the polishing rate by increasing the affinity between the abrasive grains contained in the slurry and the polishing layer. For example, PTL 2 listed below discloses a polishing pad that reduces the time required for a preparation step (break-in (start-up)) of roughening the surface of the polishing pad by a dressing treatment in the initial usage stage in which the polishing pad is attached to a polishing device and the polishing device is started. Specifically, PTL 2 discloses a polishing pad including a polishing surface pressed onto an object to be polished, wherein corrugations on the polishing surface have a cycle in the range of 5 mm to 200 mm, and a largest amplitude of 40 µm or less. PTL 2 also discloses that when the zeta potential of the polishing surface of the polishing pad is −50 mV or more and less than 0 mv, repulsion against negatively charged abrasive grains contained in the slurry for the polishing surface is suppressed, and a fit between the polishing surface of the polishing pad and the abrasive grains thus becomes better, as a result of which the break-in time can be reduced.

PTL 3 listed below discloses a polishing pad that inhibits the adhesion of polishing debris to the surface of the polishing pad so as to reduce the occurrence of scratches and defects on the surface of the object to be polished, thus increasing the product yield, and achieving high flatness and an appropriate polishing rate. Specifically, PTL 3 discloses a polishing pad wherein a zeta potential of a polishing surface opposed to the object to be polished is less than −55 mV and −100 mV or more.

PTL 4 listed below discloses a polishing pad that can perform polishing with a low load without causing defects in an insulating layer during CMP, and is fixed to a platen when used for polishing. Specifically, PTL 4 discloses a polishing pad wherein a material having a tensile modulus at room temperature of 0.2 GPa or more, and a zeta potential of +0.1 to +30 mV in a pH region of a slurry supplied between an object to be polished and the polishing pad is used for at least a portion of the surface of the polishing pad that comes into contact with the object to be polished. PTL 4 also discloses, as a comparative example, a polishing pad wherein the zeta potential is −8.5 mV when CMP is performed using an acidic slurry having a pH of 3 to 5.

CITATION LIST

Patent Literatures

[PTL 1] Japanese Laid-Open Patent Publication No. 2011-213866
[PTL 2] WO 2008-029725
[PTL 3] Japanese Laid-Open Patent Publication No. 2013-018056
[PTL 4] Japanese Laid-Open Patent Publication No. 2005-294661

SUMMARY OF INVENTION

Technical Problem

It is an object of the present invention to provide a novel polyurethane for a polishing layer, a polishing layer including a polyurethane and a modification method of the polishing layer, a polishing pad, and a polishing method.

Solution to Problem

An aspect of the present invention is directed to a polyurethane for a polishing layer, the polyurethane being a polyurethane having a Schiff base. Specific examples of the polyurethane having a Schiff base include a reaction product of a monomer raw material including at least (A) a chain extender including a Schiff base-containing chain extender, (B) a polymer diol, and (C) an organic diisocyanate Examples of the Schiff base-containing chain extender include a Schiff base-containing diol represented by the following general formula (1):

$$R1-N=C-R2 \ldots \quad (1)$$

where R1 is an alkyl group, an alkenyl group, a hydroxyphenyl group, an aminophenyl group, a hydroxybenzyl imino group, an aminobenzyl imino group, or a group containing any of these groups, R2 is a group containing a dihydroxyphenyl group when R1 is a group containing an alkyl group or an alkenyl, a group containing a hydroxyphenyl group when R1 is a group containing a hydroxyphenyl group or an aminophenyl group, or a group containing a hydroxyphenyl group when R1 is a group containing a hydroxybenzyl imino group or an aminobenzyl imino group, and R1 and R2 each may have a substituent. Specific examples thereof include 2,4-dihydroxybenzene-1-iminobutane, 2,4-dihydroxybenzene-1-iminopropane, N,N'-bis(salicylidene)ethylenediamine, 2-salicylideneaminophenol,
4-[(3-dimethylamino-propylimino)-methyl]-benzene-1,3-diol, and
3-[{4-[(3-hydroxy-propylimino)-methyl]-benzylidene}-amino]-pro pane-1-ol.

Another aspect of the present invention is directed to a polyurethane for a polishing layer, the polyurethane being a polyurethane having a Schiff base in a side chain thereof.

Preferably, the polyurethane is a polyurethane including at least a unit derived from a Schiff base-containing chain extender, a unit derived from a Schiff base-free chain extender other than the Schiff base-containing chain extender, a unit derived from a polymer diol, and a unit derived from an organic diisocyanate. A thermoplastic polyurethane is particularly preferable since it can be continuously produced by continuous melt-polymerization, and also has excellent sheet moldability.

Another aspect of the present invention is directed to a modification method of a polishing layer including a polyurethane, including: a step of preparing a polishing layer including a polyurethane having a Schiff base; and a post-treatment step of converting the Schiff base into at least one functional group selected from an aldehyde group, a carboxylic acid group, a hydroxyl group, and an amino group by a post-treatment such as an acid treatment, an oxidation treatment, or a hydration treatment. With such a modification method of a polishing layer including a polyurethane, it is possible to modify the surface properties after molding the polishing layer.

Another aspect of the present invention is directed to a polishing layer including a molded article of a polyurethane having at least one functional group selected from an aldehyde group, a carboxylic acid group, a hydroxyl group, and an amino group. It is preferable that the polishing layer has a carboxylic acid group, and a zeta potential at a pH of 3.0, of −1.0 mV or less, from the viewpoint of exhibiting high affinity for the abrasive grains not only in an alkaline slurry, but also in an acidic slurry. It is preferable that a polymer diol unit that can be used for the production of the above-described polyurethane has a number-average molecular weight of 450 to 3000, from the viewpoint of satisfying the required properties such as hydrophilicity.

It is preferable that the polyurethane used as a material of the polishing layer is a non-foam since the polishing characteristics are less likely to vary, thus making it possible to achieve stable polishing.

The polishing layer may be of a molded article type including a polyurethane molded article, or may be of a non-woven fabric type including a non-woven fabric and a polyurethane impregnated into the non-woven fabric.

It is preferable that the polishing layer has a storage modulus at 50° C. after swollen to saturation with water at 50° C., of 50 to 1200 MPa, and a contact angle with water of 80 degrees or less, since the polishing layer will also exhibit excellent polishing uniformity and polishing stability.

Another aspect of the present invention is directed to a polishing pad including any one of the above-described polishing layers.

Another aspect of the present invention is directed to a polishing method including the steps of: fixing, onto a platen of a polishing apparatus, a polishing pad that includes a polishing layer including a molded article of a polyurethane, the polyurethane, having a carboxylic acid group and a zeta potential at a pH of 3.0, of −1.0 mV or less; causing an object to be polished to be held on a holder of the polishing apparatus so as to face a polishing surface of the polishing layer; and polishing the object to be polished by causing the polishing pad and the object to be polished to slide relative to each other, while supplying an acidic slurry between the polishing surface and the object to be polished. With such a method, even in the case of performing CMP using an acidic slurry, it is possible to maintain a higher polishing rate and higher polishing uniformity by increasing the affinity with the abrasive grains contained in the slurry.

Advantageous Effects of Invention

With the polyurethane for a polishing layer according to the present invention, it is possible to cause a polishing layer to retain various functional groups, starting from the Schiff base of the polyurethane. In the case of using such a polyurethane as a polishing layer, it is possible to improve the polishing characteristics through modification of the surface properties.

DESCRIPTION OF EMBODIMENT

[Schiff Base-Containing Chain Extender]

Figure 1:
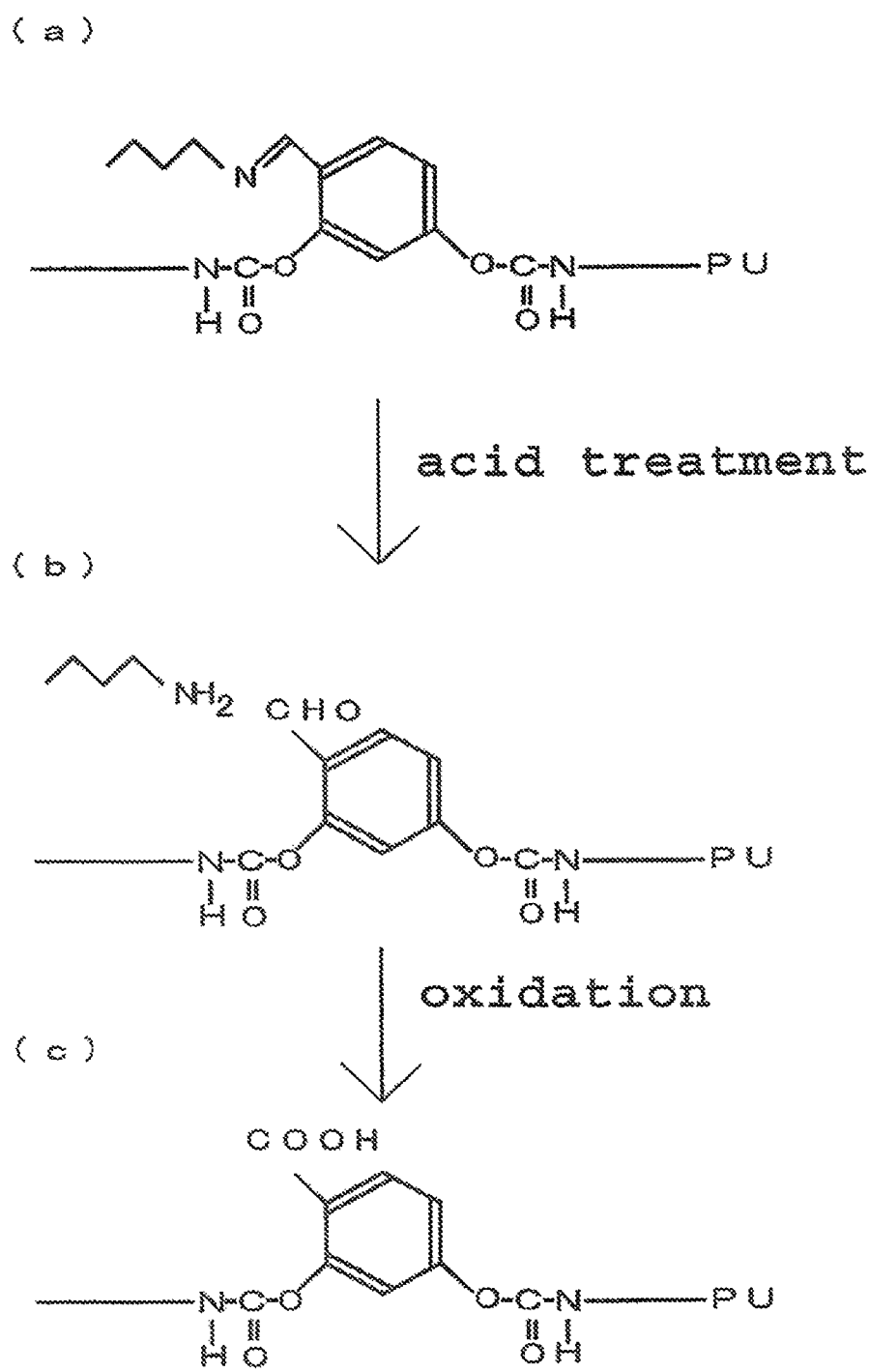
FIG. 1 is an explanatory diagram illustrating a process of modifying a polyurethane including a unit derived from 2,4-dihydroxybenzene-1-iminobutane into a polyurethane having a carboxylic acid group.

A Schiff base-containing chain extender used as a polyurethane production raw material according to the present embodiment is a diol or a diamine having a Schiff base, or a derivative thereof. Specific examples include a Schiff base-containing diol having at least two hydroxyl groups, a Schiff base-containing diamine having at least two amino groups, or a derivative thereof, each containing a Schiff base and represented by the following general formula (1):

$$R1\text{-}N\!\!=\!\!C\text{-}R2 \qquad (1)$$

where R1 is an alkyl group, an alkenyl group, a hydroxyphenyl group, an aminophenyl group, a hydroxybenzyl imino group, an aminobenzyl imino group, or a group containing any of these groups, R2 is a group containing a dihydroxyphenyl group when R1 is a group containing an alkyl group or an alkenyl, a group containing a hydroxyphenyl group when R1 is a group containing a hydroxyphenyl group or an aminophenyl group, or a group containing a hydroxyphenyl group when R1 is a group containing a hydroxybenzyl imino group or an aminobenzyl imino group, and R1 and R2 each may have a substituent. Note that examples of the derivative include a compound carboxylated by oxidizing a hydroxyl group.

Examples of the alkyl group represented by R1 in the general formula (1) include C1-18 alkyl groups such as methyl, ethyl, propyl, iso-propyl, n-butyl, iso-butyl, secbutyl, tert-butyl, pentyl, iso-pentyl, sec-pentyl, hexyl, heptyl, n-octyl, isooctyl, 2-ethylhexyl, nonyl, decyl, isodecyl, dodecyl, tetradecyl, hexadecyl, and octadecyl. Among these, C2-8 alkyl groups are preferable from the viewpoint of maintaining the reactivity and the crystallinity.

Examples of the alkenyl group represented by R1 include C2-18 alkenyl groups such as vinyl, allyl, methallyl, isopropenyl, 1-propenyl, 2-propenyl, 2-methyl-1-propenyl, butenyl, pentenyl, hexenyl, heptynyl, octenyl, nonenyl, decenyl, undecenyl, dodecenyl, tetradecenyl, haxadecenyl, and octadecenyl.

R2 is a group selected according to the type of R1, and, specifically, is a group containing a dihydroxyphenyl group when R1 is a group containing an alkyl group or an alkenyl, a group containing a hydroxyphenyl group when R1 is a group containing a hydroxyphenyl group or an aminophenyl group, and a group containing a hydroxyphenyl group when R1 is a group containing a hydroxybenzyl imino group or an aminobenzyl imino group.

Examples of such a Schiff base-containing diol include 2,4-dihydroxybenzene-1-iminobutane represented by the following formula (2), 2,4-dihydroxybenzene-1-iminopropane represented by the following formula (3), N,N'-bis(salicylidene)ethylenediamine represented by the following formula (4), 2-salicylideneaminophenol represented by the following formula (5), 4-[(3-dimethylamino-propylimino)-methyl]-benzene-1,3-diol represented by the following formula (6), and 3-[{4-[(3-hydroxy-propylimino)-methyl]-benzylidene}-amino]-propane-1-ol represented by the following formula (7).

Such a chain extender can be obtained through, for example, a reaction of monohydroxybenzaldehyde or dihydroxybenzaldehyde and N-alkyleneamine, or a reaction of N-amino alkylene alcohol and monobenzaldehyde or phthaldialdehyde.

Specific examples of the monohydroxybenzaldehyde include 3-hydroxybenzaldehyde. Specific examples of the dihydroxybenzaldehyde include 2,4-dihydroxybenzaldehyde and 3,4-dihydroxybenzaldehyde. Specific examples of the N-alkyleneamine include N-butylamine, N-propylamine, and N-amylamine. Specific examples of the N-amino alkylene alcohol include 3-amino-1-propanol. Specific examples of the monobenzaldehyde include benzaldehyde and 3-phenyl propionaldehyde. Specific examples of the phthaldialdehyde include terephthalaldehyde.

An example of the reaction of N-alkyleneamine and monohydroxybenzaldehyde or dihydroxybenzaldehyde is a reaction scheme that synthesizes 2,4-dihydroxybenzene-1-iminobutane by a reaction of 2,4-dihydroxybenzaldehyde and N-butylamine, and that is represented by the following formula (8):

Another example of the reaction of N-alkyleneamine and monohydroxybenzaldehyde or dihydroxybenzaldehyde is a reaction scheme that synthesizes 4-[(3-dimethylamino-proplylimino)-methyl]-benzene-1,3-diol by a reaction between 2,4-dihydroxybenzaldehyde and N,N-dimethyl-1,3-propane diamine, and that is represented by the following formula (9):

[Chem. 8]

(9)

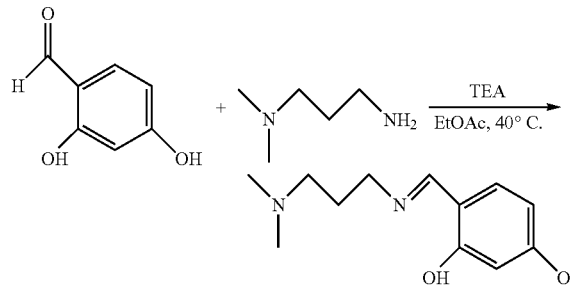

An example of the reaction of N-amino alkylene alcohol and monobenzaldehyde or phthaldialdehyde is a reaction scheme that yields 3-[{4-[(3-hydroxy-propylimino)-methyl]-benzylidene}-amino]-propane-1-ol by a reaction of 3-amino-1-propanol and terephthalaldehyde, and that is represented by the following formula (10):

[Chem. 9]

(10)

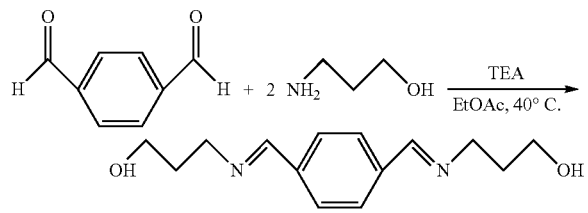

Note that each of the above-described reactions is performed, for example, in the following manner. N-alkyleneamine and monohydroxybenzaldehyde or dihydroxybenzaldehyde, or N-amino alkylene alcohol and monobenzaldehyde or phthaldialdehyde are dissolved in a predetermined solvent, and a base catalyst such as triethylamine is further added thereto. Then, while being stirred at a predetermined temperature, the solution is held for a predetermined time until the reaction is completed, thus allowing the reaction to proceed.

The solvent is not particularly limited as long as it dissolves N-alkyleneamine and monohydroxybenzaldehyde or dihydroxybenzaldehyde, or N-amino alkylene alcohol and monobenzaldehyde or phthaldialdehyde, and the specific examples include ethyl acetate and dichloromethane. The solvents may be used alone or in a combination of two or more.

Specific examples of the base catalyst include triethylamine and pyridine.

The reaction temperature is not particularly limited as long as it is a temperature that allows the reaction to proceed quickly and can provide a target material with a high yield, and is preferably reacted at about 25 to 50° C., for example. The reaction temperature may be constant, or may be increased or decreased step-wise or continuously.

Then, after completion of the reaction, the reactant was precipitated from the reaction liquid resulting from the reaction, then is separated by a crystallization treatment such as recrystallization, followed by suction filtration, and is collected as a crude crystal. Then, the collected crude crystal is washed with a suitable solvent, followed by drying, to take out the target material.

The thus obtained Schiff base-containing diol has a melting point as measured by a differential scanning calorimetry (DSC) measurement, of, for example, preferably about −30 to 200° C., more preferably about −20 to 190° C., because of the suitability for polyurethane production. For example, the melting point of 2,4-dihydroxybenzene-1-iminobutane is 151° C., the melting point of 4-[(3-dimethylamino-propylimino)-methyl]-benzene-1,3-diol is 146° C., the melting point of 3-[{4-[(3-hydroxy-propylimino)-methyl]-benzylidene}-amino]-propane-1-ol is 155° C., the melting point of N,N'-bis(salicylidene)ethylenediamine is 127° C., and the melting point of 2-salicylideneaminophenol is 185° C.

The thus obtained Schiff base-containing diol has a 5% heat weight loss temperature as measured by thermogravimetric analysis at a temperature rising rate of 10° C./min under a stream of nitrogen, of preferably 80° C. or more, more preferably 90° C. or more. For example, the 5% heat weight loss temperature of 2,4-dihydroxybenzene-1-iminobutane is 163° C., the 5% heat weight loss temperature of 4-[(3-dimethylamino-propylimino)-methyl]-benzene-1,3-diol is 169° C., the 5% heat weight loss temperature of N,N'-bis(salicylidene)ethylenediamine is 233° C., and the 5% heat weight loss temperature of 3-[{4-[(3-hydroxy-propylimino)-methyl]-benzylidene}-amino]-propane-1-ol is 228° C.

The Schiff base-containing chain extender is preferably used as a chain extender serving as a production raw material of various types of polyurethanes. The polyurethane may be a thermoplastic polyurethane, or may be a thermosetting polyurethane. From the viewpoint of the sheet moldability, it is preferable that the polyurethane is a thermoplastic polyurethane when used as a polishing layer of a polishing pad. As will be described below, a polyurethane obtained using the Schiff base-containing chain extender is allowed to retain various functional groups, starting from the Schiff base by being subjected to a post-treatment such as an acid treatment, an oxidation treatment, or a hydration treatment. Such a polyurethane can be preferably used in various applications of polyurethanes for which modification in hydrophilicity or electrical properties or the like is required.

[Thermoplastic Polyurethane]

In the following, a thermoplastic polyurethane will be described in detail as a representative example of a polyurethane having a Schiff base, produced using the Schiff base-containing chain extender as a production raw material.

The thermoplastic polyurethane of the present embodiment is obtained by polymerizing a raw material that contains at least a chain extender including a Schiff base-containing chain extender, a polymer diol, and an organic diisocyanate.

Specific examples of the Schiff base-containing chain extender include the above-described Schiff base-containing diols or Schiff base-containing diamine such as 2,4-dihydroxybenzene-1-iminobutane, 2,4-dihydroxybenzene-1-iminopropane, N,N'-bis(salicylidene)ethylenediamine, 2-salicylideneaminophenol, 4-[(3-dimethylamino-propylimino)-methyl]-benzene-1,3-diol or 3-[{4-[(3-hydroxy-propylimino)-methyl]-benzylidene}-amino]-propane-1-ol, or derivatives thereof. These may be used alone or in a combination of two or more. Among these, 2,4-dihydroxybenzene-1-iminobutane is particularly preferable since the reactivity, the properties of a liberated product, and the crystallinity can be easily maintained.

The chain extender including a Schiff base-containing chain extender may be used in combination with a Schiff base-free chain extender that does not contain any Schiff base. Examples of the Schiff base-free chain extender include a low-molecular weight compound that does not have any Schiff base, has, in the molecule, two or more active hydrogen atoms capable of reacting with an isocyanate group, has a molecular weight of 300 or less, and has been conventionally used for production of polyurethanes. Specific examples thereof include: diols such as ethylene glycol, diethylene glycol, 1,2-propane diol, 1,3-propane diol, 2,2-diethyl-1,3-propane diol, 1,2-butane diol, 1,3-butane diol, 2,3-butane diol, 1,4-butane diol, 1,5-pentane diol, neopentyl glycol, 1,6-hexane diol, 3-methyl-1,5-pentane diol, 1,4-bis(β-hydroxyethoxy)benzene, 1,4-cyclohexane diol, cyclohexane dimethanol (1,4-cyclohexane dimethanol, etc.), bis(β-hydroxyethyl)terephthalate, 1,9-nonane diol, m-xylylene glycol, p-xylylene glycol, diethylene glycol, and triethylene glycol; and diamines such as ethylenediamine, trimethylenediamine, tetramethylenediamine, hexamethylenediamine, heptamethylenediamine, octamethylenediamine, nonamethylenediamine, decamethylenediamine, undecamethylenediamine, dodecamethylenediamine, 2,2,4-trimethylhexamethylenediamine, 2,4,4-trimethylhexamethylenedi amine, 3-methylpentamethylenediamine, 1,2-cyclohexanediamine, 1,3-cyclohexanediamine, 1,4-cyclohexanediamine, 1,2-diaminopropane, hydrazine, xylylenediamine, isophoronediamine, piperazine, o-phenylenediamine, m-phenylenediamine, p-phenylenediamine, tolylenediamine, xylenediamine, adipic acid dihydrazide, isophthalic acid dihydrazide, 4,4'-diaminodiphenylmethane, 4,4'-diaminodiphenylether, 4,4'-bis(4-aminophenoxy)biphenyl, 4,4'-bis(3-aminophenoxy)biphenyl, 1,4-bis(4-aminophenoxy)benzene, 1,3-bis(4-aminophenoxy)benzene, 1,3-bis(3-aminophenoxy)benzene, 3,4'-diaminodiphenylether, 4,4'-diaminodiphenylsulfone, 3,4-diaminodiphenylsulfone, 3,3'-diaminodiphenylsulfone, 4,4'-methylene-bis(2-chloroaniline), 3,3'-dimethyl-4,4'-diaminobiphenyl, 4,4'-diaminodiphenylsulfide, 2,6-diaminotoluene, 2,4-diaminochlorobenzene, 1,2-diaminoanthraquinone, 1,4-diaminoanthraquinone, 3,3'-diaminobenzophenone, 3,4-diaminobenzophenone, 4,4'-diaminobenzophenone, 4,4'-diaminobibenzyl, 2,2'-diamino-1,1'-binaphthalene, 1,n-bis(4-aminophenoxy)alkanes (n is 3 to 10), including, for example, 1,3-bis(4-aminophenoxy)alkane, 1,4-bis(4-aminophenoxy)alkane and 1,5-bis(4-aminophenoxy)alkane, 1,2-bis[2-(4-aminophenoxy)ethoxy]ethane, 9,9-bis(4-aminophenyl)fluorene, and 4,4'-diaminobenzanilide. These may be used alone or in a combination of two or more. Among these, 1,4-butane diol is preferable.

The ratio (mol %) of the Schiff base-containing chain extender relative to the total amount of the Schiff base-containing chain extender and the Schiff base-free chain extender in the case of using the Schiff base-free chain extender is appropriately selected according to the purpose. Specifically, the ratio is, for example, preferably 5 to 95 mol %, more preferably 10 to 90 mol %. When the content ratio of the Schiff base-containing chain extender is too low, the modification effect, which will be described below, tends to be reduced.

Specific examples of the polymer diol include polyether diol, polyester diol, and polycarbonate diol. These may be used alone or in a combination of two or more. Among these, polyether diol and polyester diol are preferable. The number-average molecular weight of the polymer diol is preferably 450 to 3000, more preferably 500 to 2700, particularly preferably 500 to 2400, since a polishing layer for which the required properties such as the rigidity and the hydrophilicity are maintained can be easily obtained. Note that the number-average molecular weight of the polymer diol means a number-average molecular weight calculated based on a hydroxyl value measured in accordance with JIS K 1557.

Specific examples of the polyether diol include polyethylene glycol, polypropylene glycol, polytetramethylene glycol, poly(methyltetramethylene glycol), and glycerin-based polyalkylene ether glycol. These may be used alone or in a combination of two or more. Among these, it is preferable to use polyethylene glycol and polytetramethylene glycol, and in particular, polytetramethylene glycol is preferable.

A polyester diol can be obtained, for example, by a direct esterification reaction or a transesterification reaction of a dicarboxylic acid or an ester or ester-forming derivative (anhydride, etc.) thereof and a low-molecular weight diol.

Examples of the dicarboxylic acid or an ester or ester-forming derivative (anhydride, etc.) thereof for producing the polyester diol include the following compounds: Aliphatic dicarboxylic acids, including, for example, C2-12 aliphatic dicarboxylic acids such as oxalic acid, succinic acid, glutaric acid, adipic acid, pimelic acid, suberic acid, azelaic acid, sebacic acid, dodecanedicarboxylic acid, 2-methylsuccinic acid, 2-methyladipic acid, 3-methyladipic acid, 3-methylpentanedioic acid, 2-methyloctanedioic acid, 3,8-dimethyldecanedioic acid, and 3,7-dimethyldecanedioic acid; and also C14-48 dimerized aliphatic dicarboxylic acids (dimer acids) obtained by the dimerization of unsaturated fatty acids obtained by the fractional distillation of triglycerides, as well as the hydrogenated products from these C14-48 dimerized aliphatic dicarboxylic acids (hydrogenated dimer acids); alicyclic dicarboxylic acids such as 1,4-cyclohexanedicarboxylic acid; and aromatic dicarboxylic acids such as terephthalic acid, isophthalic acid, and ortho-phthalic acid. Specific examples of the dimer acid and the hydrogenated dimer acid include "Pripol 1004", "Pripol 1006", "Pripol 1009", and "Pripol 1013" (trade names, manufactured by Unichema). These may be used alone or in a combination of two or more.

Specific examples of the low-molecular weight diol for producing the polyester diol include the following compounds: Aliphatic diols such as ethylene glycol, 1,3-propanediol, 1,2-propanediol, 2-methyl-1,3-propanediol, 1,4-butanediol, neopentyl glycol, 1,5-pentanediol, 3-methyl-1,5-pentanediol, 1,6-hexanediol, 1,7-heptanediol, 1,8-octanediol, 2-methyl-1,8-octanediol, 1,9-nonanediol, and 1,10-decanediol; and alicyclic diols such as cyclohexanedimethanol and cyclohexanediol. These may be used alone or in a combination of two or more. Among these, C6-12 diols are preferable, C8-10 diols are more preferable, and C9 diols are particularly preferable.

Examples of the polycarbonate diol include polycarbonate diols obtained by the reaction of a low-molecular weight diol and a carbonate compound such as dialkyl carbonate, alkylene carbonate, and diaryl carbonate. Examples of the low-molecular weight diol for producing the polycarbonate diol include the low-molecular weight diols listed above as examples. Examples of the dialkyl carbonate include dimethyl carbonate and diethyl carbonate. Examples of the alkylene carbonate include ethylene carbonate. Examples of the diaryl carbonate include diphenyl carbonate.

As the organic diisocyanate, any organic diisocyanate that has been conventionally used for the production of polyurethanes can be used without any particular limitation. Specific examples thereof include aliphatic or alicyclic diisocyanates such as ethylene diisocyanate, tetramethylene diisocyanate, pentamethylene diisocyanate, hexamethylene diisocyanate, 2,2,4-trimethylhexamethylene diisocyanate, 2,4,4-trimethylhexamethylene diisocyanate, dodecamethylene diisocyanate, isophorone diisocyanate, isopropylidene bis(4-cyclohexyl isocyanate), cyclohexylmethane diisocyanate, methylcyclohexane diisocyanate, 4,4'-dicyclohexylmethane diisocyanate, lysine diisocyanate, 2,6-diisocyanatomethyl caproate, bis(2-isocyanatoethyl)fumarate, bis(2-isocyanatoethyl)carbonate, 2-isocyanatoethyl-2,6-diisocyanatohexanoate, cyclohexylene diisocyanate, methylcyclohexylene diisocyanate and bis(2-isocyanatoethyl)-4-cyclohexylene; and aromatic diisocyanates such as 2,4'-diphenylmethane diisocyanate, 4,4'-diphenylmethane diisocyanate, 2,4-tolylene diisocyanate, 2,6-tolylene diisocyanate, m-phenylene diisocyanate, p-phenylene diisocyanate, m-xylylene diisocyanate, p-xylylene diisocyanate, 1,5-naphthylene diisocyanate, 4,4'-diisocyanatobiphenyl, 3,3'-dimethyl-4,4'-diisocyanatobiphenyl, 3,3'-dimethyl-4,4'-diisocyanatodiphenylmethane, chlorophenylene-2,4-diisocyanate, and tetramethylxylylene diisocyanate. These may be used alone or in a combination of two or more. Among these, 4,4'-diphenylmethane diisocyanate is particularly preferable in terms of the excellent abrasion resistance of the resulting polishing layer.

The thermoplastic polyurethane is obtained by a urethanation reaction using a known prepolymer method or one-shot method by using a raw material containing at least the chain extender including a Schiff base-containing chain extender, the polymer diol, and the organic diisocyanate that are described above. Preferably, a thermoplastic polyurethane is obtained by a method in which continuous melt-polymerization is performed substantially in the absence of a solvent by using a single-screw or multi-screw extruder, while melt-mixing the above-described components mixed at a predetermined ratio.

The mixing ratio of the various components is appropriately adjusted according to the intended characteristics. For example, the components are preferably mixed such that the ratio of the isocyanate group contained in the organic polyisocyanate is preferably 0.95 to 1.3 moles, more preferably 0.96 to 1.10 moles, particularly preferably 0.97 to 1.05 mol, per mole of the active hydrogen atoms contained in the polymer diol and the chain extender. When the ratio of the isocyanate group contained in the organic diisocyanate is too low, the mechanical strength and the abrasion resistance of the thermoplastic polyurethane tend to be reduced, resulting in a shorter life of the polishing layer. On the other hand, when the ratio of the isocyanate group is too high, the productivity and the storage stability of the thermoplastic polyurethane tend to be reduced, making it difficult to produce the polishing layer.

The thermoplastic polyurethane obtained by performing continuous melt-polymerization can be, for example, pelletized, and subsequently molded into a sheet-like molded article by using any one of various molding methods such as extrusion molding, injection molding, blow molding, and calendering. In particular, it is preferable to use extrusion molding with a T-die since a sheet-like molded article having a uniform thickness can be obtained.

The thermoplastic polyurethane may optionally contain additives such as a cross-linking agent, a filler, a cross-linking accelerator, a cross-linking auxiliary, a softening agent, a tackifier, an aging inhibitor, a foaming agent, a processing auxiliary, an adhesion-imparting agent, an inorganic filler, an organic filler, a crystal nucleating agent, a heat stabilizer, a weathering stabilizer, an antistatic agent, a colorant, a lubricant, a flame retardant, a flame retardant auxiliary (antimony oxide etc.), a blooming inhibitor, a release agent, a thickener, an antioxidant, and a conductive agent. The content ratio of the additive in the thermoplastic polyurethane is not particularly limited, but is preferably 50 mass % or less, more preferably 20 mass % or less, particularly preferably 5 mass % or less.

The polyurethane according to the present embodiment is a polyurethane having a Schiff base. By using the Schiff base included in the polyurethane, the polyurethane can be modified so as to have a wide variety of properties. Specifically, a polyurethane having a Schiff base can be allowed to retain an aldehyde group, a carboxylic acid group, a hydroxyl group, and an amino group, starting from the Schiff base, by being subjected to a modification treatment by a post-treatment such as an acid treatment, an oxidation treatment, or a hydration treatment, and can also further convert these functional groups. As a result, it is possible to achieve a wide variety of surface modifications in the surface electric properties, the hydrophilicity, and the like. Next, this modification treatment will be described in detail.

When a Schiff base introduced in a polyurethane is treated under an acidic condition, the Schiff base on the surface of the polyurethane is hydrolyzed to be decomposed into aldehyde and amine. By appropriately selecting the type of the Schiff base-containing chain extender, it is possible to leave the aldehyde group on the surface of the polyurethane, and liberate the amino compound, or it is possible to leave the amino group on the surface of the polyurethane, and liberate the aldehyde compound.

For example, as shown in (a) of FIG. 1, in the case of a polyurethane that is caused to retain a Schiff base in the polyurethane chain PU by using 2,4-dihydroxybenzene-1-iminobutane as the Schiff base-containing chain extender, the Schiff base is hydrolyzed by an acid treatment, and is decomposed into an amino group and an aldehyde group, to liberate butylamine, as shown in (b) of FIG. 1. As a result, the aldehyde group is left in the polyurethane. Then, oxidation of the aldehyde group in the polyurethane yields a polyurethane having a carboxylic acid group as shown in (c) of FIG. 1.

The conditions for the acid treatment for decomposing the Schiff base into an amino group and an aldehyde group is not particularly limited, and specific examples thereof include contacting with an acidic solution such as hydrochloric acid, acetic acid, sulfuric acid, dilute sulfuric acid, nitric acid, or acidic solutions thereof. Among these, it is preferable to use hydrochloric acid or dilute sulfuric acid from the viewpoint of suppressing the decomposition of the urethane bond. A modification treatment through hydrolysis yields a polyurethane having an aldehyde group. Then, by performing an oxidation treatment of the polyurethane having an aldehyde group in a solution in which an oxidizing agent is added, a polyurethane having a carboxylic acid group is obtained. Specific examples of the oxidizing agent include potassium nitrate, hypochlorous acid, halogen, a permanganate, ceric ammonium nitrate, chromic acid, a peroxide such as a hydrogen peroxide solution, a TEMPO reagent, and ruthenic acid. Among these, a hydrogen peroxide solution is particularly preferable in terms of the stable oxidation capability at about 25 to 50° C. and the suppression of degradation of the polyurethane.

Figure 2:
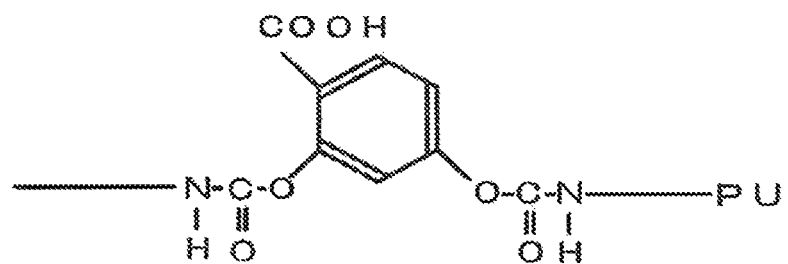
FIG. 2 is an explanatory diagram illustrating dissociation of a carboxylic acid group introduced into a polyurethane.
Figure 2:
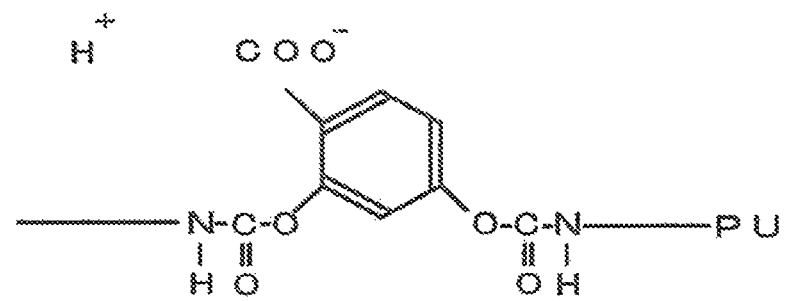

As shown in FIG. 2, when the carboxylic acid group of the polyurethane comes into contact with an aqueous solution having a pH that causes ionization of the carboxylic acid group including an acidic region, the carboxylic acid group is dissociated into —COO$^-$ and H$^+$. Then, the —COO$^-$ on the surface imparts a negative potential to the surface of the polyurethane. In the application as a polishing layer for a polishing pad, which will be described below, such a negative potential reduces the zeta potential in the acidic region, and increases the affinity with the abrasive grains contained in an acidic slurry.

Figure 3:
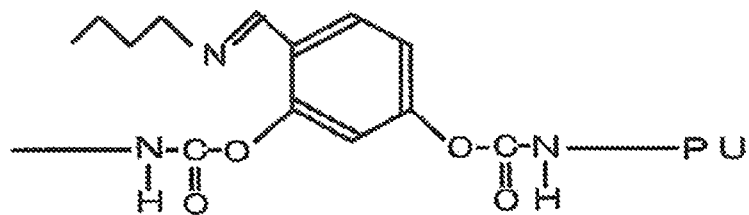
FIG. 3 is an explanatory diagram illustrating a process of hydrating an aldehyde group that has been introduced into a polyurethane, to modify the polyurethane into a polyurethane having hydroxyl groups.
Figure 3:
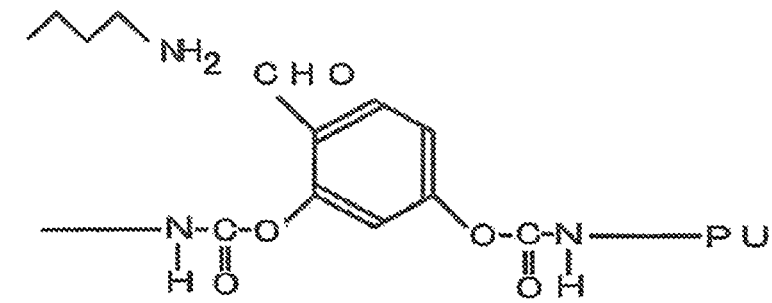
Figure 3:
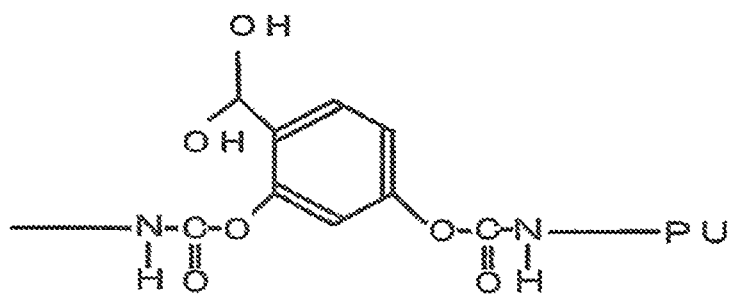

For example, as shown in FIG. 3, in the case of a polyurethane that is caused to retain a Schiff base by using 2,4-dihydroxybenzene-1-iminobutane as the Schiff base-containing chain extender, the Schiff base is cleaved through hydrolysis by being subjected to an acid treatment, and is decomposed into an aldehyde group in the side chain and butyl amine that is liberated. Then, by hydrating the aldehyde group of the polyurethane having an aldehyde group, a polyurethane having a hydroxyl group is obtained. Examples of the means for hydration include, but are not particularly limited to, a method in which the aldehyde group is retained by using water as the solvent for an acidic solution used for the acid treatment, and thereafter hydrating the aldehyde group by bringing it into contact with water, and a method in which the aldehyde group is reduced into a hydroxyl group using a reducing agent.

The hydroxyl group of a polyurethane having a hydroxyl group increases the hydrophilicity of the surface of the polyurethane, thus enhancing the wettability thereof. Additionally, oxidation of the hydroxyl group of the polyurethane having a hydroxyl group yields a polyurethane having a carboxylic acid group. Specific examples of the oxidizing agent for oxidizing the hydroxyl group of the polyurethane having a hydroxyl group include potassium nitrate, hypochlorous acid, halogen, a permanganate, ceric ammonium nitrate, chromic acid, a peroxide such as a hydrogen peroxide solution, a TEMPO reagent, and ruthenic acid. Among these, a hydrogen peroxide solution is particularly preferable in terms of the stable oxidation capability and the ability to suppress the degradation of the polyurethane at about 25 to 50° C.

Figure 4:
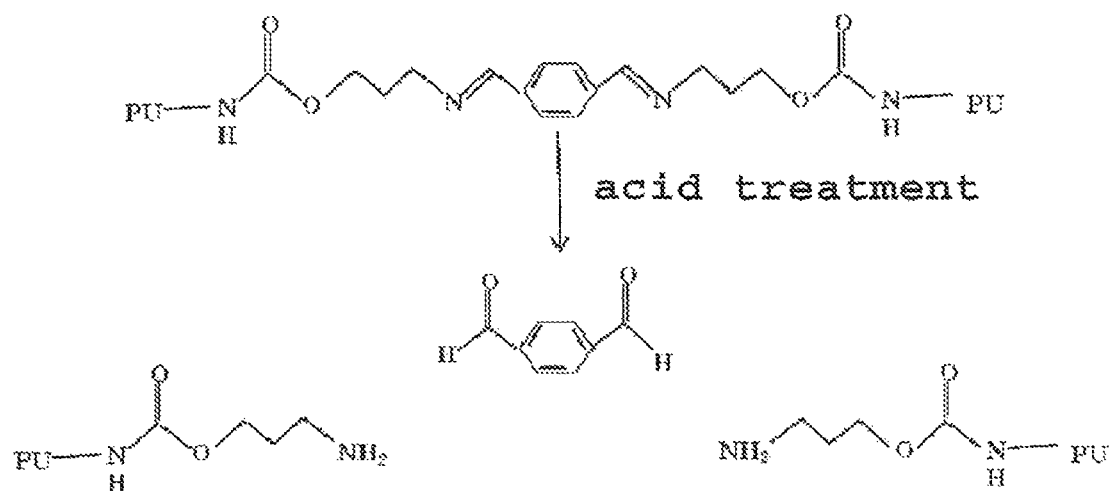
FIG. 4 is an explanatory diagram illustrating a process of causing a polyurethane to retain amino groups by hydrolyzing a Schiff base retained in the polyurethane by an acid treatment.

For example, as shown in the example of FIG. 4, in the case of a polyurethane that is caused to retain a Schiff base by using 3-[{4-[(3-hydroxy-propylimino)-methyl]-benzylidene}-amino]-propane-1-ol as the Schiff base-containing chain extender, the Schiff base is hydrolyzed by being subjected to an acid treatment, and is decomposed into primary amines that are retained in the side chains of the polyurethane, and terephthalaldehyde that is liberated. In this manner, a polyurethane having an amino group is obtained. The amino group of the polyurethane having an amino group is used to impart a positive potential, and to form a crosslinking point.

[Polishing Pad]

By utilizing the above-described properties, the polyurethane according to the present embodiment as described above can be used as a polyurethane material of various types of polishing layers such as a polishing layer including a non-foam or foam polyurethane molded article in the polishing pad, a non-woven fabric polishing layer in which a polyurethane is included in the internal voids of a non-woven fabric, and a polishing layer composed mainly of a polyurethane foam produced by foaming and curing by casting. The polyurethane may be either a thermoplastic polyurethane or a thermosetting polyurethane. In the following, the properties and the configuration of a polishing pad using the polyurethane according to the present embodiment will be described in detail.

(Properties of Polishing Layer Using Polyurethane Having Carboxylic Acid Group)

For example, as the slurry used for CMP, an acidic slurry and an alkaline slurry are available. The acidic slurry and the alkaline slurry may be selectively used according to the purpose of polishing, or may be used in combination in the case of performing a multi-step polishing process. The abrasive grains contained in the alkaline slurry usually have a negative zeta potential. It seems that, in the case of using a polishing layer whose zeta potential is negative when an alkaline slurry is used, the zeta potential of the polishing layer can be maintained negative, which makes polishing debris less likely to adhere to the polishing layer, thus achieving the effect of reducing the occurrence of scratches and defects. However, in the case of a polishing layer whose zeta potential is negative in an alkaline condition, the zeta potential of the polishing layer is often positive when an acidic slurry is used.

The abrasive grains contained in an acidic slurry often have a positive zeta potential. On the other hand, for example, the zeta potential on the surface of a silicon wafer is usually negative in an acidic condition. In this case, it seems that the negative electric charge on the surface of the silicon wafer and the positive electric charge of the abrasive grains contained in the acidic slurry attract each other, thus resulting in high mutual affinity. On the other hand, the zeta potential of a commonly used polyurethane tends to be positive in an acidic region, in particular, a pH region lower than a pH of 3, reach the isoelectric point near a pH of 3 to approach 0, and to be negative in an alkaline region having a high pH.

When a base material whose zeta potential is negative in an acidic region is polished with a polishing layer of a polyurethane whose zeta potential is positive in the acidic region by using abrasive grains whose zeta potential is positive in an acidic slurry, it seems that the polishing layer having a positive zeta potential and the abrasive grains having a positive zeta potential repel each other, resulting in poor affinity. Therefore, when a base material whose zeta potential is negative in an acidic region is polished with an acidic slurry, it seems to be preferable to use a polishing layer whose zeta potential is more negative in the acidic region. The present inventors have considered that, in such a case, a slurry exhibiting a positive zeta potential is interposed between a base material exhibiting a negative zeta potential and a polishing layer exhibiting a negative zeta potential, so that the abrasive grains exhibit high affinity for both the base material and the polishing layer, thus resulting in an improved polishing rate.

A polyurethane of a first example that is used as a material of a polishing layer according to the present embodiment is a polyurethane having a carboxylic acid group. With a polishing layer using a polyurethane having a carboxylic acid group on the surface thereof as a material, it is possible to achieve a polishing layer whose surface zeta potential at a pH of 3.0 is −1.0 mV or less as a result of the carboxylic acid group on the surface being dissociated into —COO⁻ when coming into contact with an acidic slurry. When the zeta potential at a pH of 3.0 is −1.0 mV or less, the polishing layer exhibits high affinity for the abrasive grains that exhibit a positive zeta potential in an acidic region. Then, the abrasive grains that exhibit a positive zeta potential are interposed between the base material that exhibits a negative zeta potential in the acidic region and the polishing layer of the present example that exhibits a negative zeta potential, so that the abrasive grains exhibit high affinity for both the base material and the polishing layer, thus making it possible to achieve a high polishing rate.

The zeta potential at a pH of 3.0 of the polishing layer using the polyurethane having a carboxylic acid group as a material is preferably −1.0 to −40 mV, more preferably −2.0 to −30 mV, particularly preferably −3.0 to −27 mV, quite particularly preferably −5.0 to −20 mV. When the zeta potential at a pH of 3.0 of the polishing layer is too high, the polishing slurry and the polishing layer electrically repel each other, thus resulting in low affinity. On the other hand, when the zeta potential at a pH of 3.0 is too low, an excessive amount of the slurry is retained on the polishing surface, so that more scratches may tend to occur on the polished surface. Here, a zeta potential is a potential that is generated on the surface (slip plane) of an electric double layer by counter ion according to the surface electric charge of a substance when the substance comes into contact with a liquid. In the present embodiment, the zeta potential is a zeta potential measured with an electrophoretic light scattering device (ELS-Z, manufactured by Otsuka Electronics Co., Ltd.), using a monitor latex (manufactured by Otsuka Electronics Co., Ltd.) dispersed in a 10 mM aqueous NaCl solution that had been adjusted to a pH of 3.0 with an aqueous HCl solution.

The zeta potential at a pH of 4.0 of the polishing layer using the polyurethane having a carboxylic acid group as a material is preferably −1.0 mV or less, more preferably −5.5 to −40 mV, particularly preferably −7.5 to −30 mV, quite particularly preferably −10.0 to −30 mV, since a polishing layer having a zeta potential at a pH of 3.0 of −1.0 mV or less can be easily obtained.

(Properties of Polishing Layer Using Polyurethane Having Hydroxyl Group)

The slurry used for CMP is usually an aqueous dispersion using an aqueous medium such as water. Accordingly, the higher the hydrophilicity of the surface of the polishing layer that comes into contact with the slurry on a polishing pad used for CMP, the higher the affinity of the surface with the slurry as well.

The polishing layer according to the present embodiment that uses the polyurethane having a hydroxyl group on the surface thereof as a material can achieve a high polishing rate as a result of the hydroxyl group on the surface increasing the hydrophilicity when coming into contact with the slurry, which is an aqueous dispersion.

(Properties of Polishing Layer Using Polyurethane Having Amino Group)

With the polishing layer according to the present embodiment that uses a polyurethane having an amino group on the surface thereof as a material, it is possible to provide a polishing layer whose zeta potential is positive in a basic region as well. It seems to be preferable to use a polishing layer whose zeta potential is positive in a basic region because it can be considered that the polishing rate is improved by the high affinity expressed between the polishing layer that exhibits a positive zeta potential and the slurry that exhibits a negative zeta potential.

(Preferable Properties Common to Polyurethanes for Producing Polishing Layer)

Each of the polyurethanes shown above as examples has a storage modulus at 50° C. after swollen to saturation with water at 50°, of preferably 50 to 1200 MPa, more preferably 100 to 1100 MPa, particularly preferably 200 to 1000 MPa. When the storage modulus at 50° C. after swollen to saturation with water at 50° of the polyurethane is too low, the polishing layer becomes too soft, so that the polishing rate is reduced. If it is too high, increased scratches tend to occur on the surface to be polished of the object to be polished.

The content of the nitrogen atoms derived from the isocyanate group of each of the polyurethanes is preferably 4.5 to 7.6 mass %, more preferably 5.0 to 7.4 mass %, particularly preferably 5.2 to 7.3 mass %, since a thermoplastic polyurethane having a storage modulus at 50° C. after swollen to saturation with water at 50°, of 50 to 1200 MPa can be easily obtained.

The contact angle with water of each of the polyurethanes is preferably 80 degrees or less, more preferably 78 degrees or less, particularly preferably 76 degrees or less, quite particularly preferably 74 degrees or less. When the contact angle with water of the polyurethanes is too large, the hydrophilicity on the polishing surface of the polishing layer is reduced, so that scratches tend to increase.

(Configuration of Polishing Layer)

The polyurethane according to the present embodiment can be used as a polyurethane material of various types of polishing layers such as a polishing layer including a non-foam or foam polyurethane molded article in the polishing pad, a non-woven fabric-type polishing layer in which a polyurethane is included in the internal voids of a non-woven fabric, and a polishing layer composed mainly of a polyurethane foam produced by foaming and curing by casting. The polyurethane may be either a thermoplastic polyurethane or a thermosetting polyurethane. Among these, a polishing layer of a thermoplastic polyurethane molded article is preferable since it can be continuously produced by continuous melt-polymerization, and also has excellent sheet moldability. A polishing layer of a non-foam thermoplastic polyurethane molded article is particularly preferable since the polishing characteristics thereof are less likely to vary, thus making it possible to achieve stable polishing. For example, in the case of a polishing layer using a foamed polyurethane produced by forming and curing by casting, the polishing characteristics such as the flatness and the planarization efficiency are likely to vary due to variations of the foam structure, and increasing the hardness for enhancing the flatness tends to be difficult.

The polyurethane molded article may be either a foam or a non-foam, but may be preferably a non-foam since the polishing characteristics are less likely to vary due to the high rigidity and the uniformity of the material, thus making it possible to achieve stable polishing. For example, in the case of using a molded article of a foamed polyurethane produced by forming and curing by casting, the polishing characteristics such as the flatness and the planarization efficiency are likely to vary due to variations of the foam structure, and increasing the hardness for enhancing the flatness tends to be difficult. As the polyurethane molded article, a molded article of a thermoplastic polyurethane is particularly preferable since it can be continuously produced by continuous melt-polymerization, and also has excellent sheet moldability.

In the case of a polyurethane molded article, the density of the molded article is preferably 1.0 g/cm$^3$ or more, more preferably 1.1 g/cm$^3$ or more, particularly preferably 1.2 g/cm$^3$ or more. When the density of the polyurethane molded article is too low, the polishing layer tends to become too soft, resulting in a reduction in the local flatness.

On the other hand, a non-woven fabric-type polishing layer is produced, for example, by such a method in which a non-woven fabric is impregnated with a polyurethane solution produced by solution polymerization, or a polyurethane solution obtained by dissolving a polyurethane produced by solution polymerization in an organic solvent of dimethylformamide (DMF) or the like, and the polyurethane is included in the internal void of the non-woven fabric by wet solidification or dry solidification.

As the non-woven fabric used for producing a non-woven fabric-type polishing layer, any non-woven fabric that has been conventionally used for a non-woven fabric-type polishing layer can be used without any particular limitation. A preferable example is a non-woven fabric of fibers having a fineness of 1 to 10 dtex and composed mainly of a polyester resin.

In the case of a non-woven fabric-type polishing layer, the density thereof is preferably 0.30 g/cm$^3$ or more, more preferably 0.40 g/cm$^3$ or more. When the density of the polyurethane molded article is too low, the polishing layer tends to become too soft, resulting in a reduction in the local flatness. The polyurethane content is preferably about 10 to 50 mass %.

(Surface Processing of Polishing Layer)

The polishing layer is finished by adjusting the dimensions, shape, thickness and the like of a sheet-like molded article or non-woven fabric-type of polyurethane by cutting, slicing, punching, and the like. The thickness of the polishing layer is not particularly limited, but is preferably 0.3 to 5 mm, more preferably 1.7 to 2.8 mm, particularly preferably 2.0 to 2.5 mm, because of the ease of production and handling, and the stability of the polishing performance.

The hardness of each of the polishing layers is preferably 60 or more, preferably 65 or more, as a JIS-D hardness. When the JIS-D hardness is too low, the ability of the polishing pad to follow the surface to be polished tends to be high, resulting in a reduction in the local flatness.

Preferably, recesses such as grooves and holes are formed in a predetermined concentric pattern on the polishing surface of each of the polishing layers by grinding or laser processing. Such recesses are useful for uniformly and sufficiently supplying a polishing slurry to the polishing surface, as well as discharging polishing debris that could cause scratches, and preventing a damage to the wafer caused by adsorption by the polishing layer. For example, in the case of forming grooves concentrically, the interval between the grooves is preferably about 1.0 to 50 mm, more preferably about 1.5 to 30 mm, particularly preferably about 2.0 to 15 mm. The width of the grooves is preferably about 0.1 to 3.0 mm, more preferably about 0.2 to 2.0 mm. The depth of the grooves is preferably about 0.2 to 1.8 mm, more preferably about 0.4 to 1.5 mm. The cross-sectional shape of the grooves may be appropriately selected from, for example, a rectangular shape, a trapezoidal shape, a triangular shape, and a semicircular shape, according to the purpose.

The polishing pad may be formed only by a polishing layer made of any of the above-described polyurethanes, or may be a stack in which a cushioning layer is optionally stacked on the surface of a polishing layer that is different from the polishing surface. It is preferable that the cushioning layer is a layer having a hardness lower than the hardness of the polishing layer. When the hardness of the cushioning layer is lower than the hardness of the polishing layer, the hard polishing layer follows the local irregularities of the surface to be polished, and the cushioning layer follows the warpage and the undulations on the entire base material to be polished, so that it is possible to achieve polishing that is well-balanced in the global flatness and the local flatness.

Specific examples of materials that can be used as the cushioning layer include composites (e.g., "Suba 400" manufactured by (Nitta Haas Incorporated)) obtained by impregnating a non-woven fabric with a polyurethane; rubbers such as a natural rubber, a nitrile rubber, a polybutadiene rubber, and a silicone rubber; thermoplastic elastomers such as a polyester-based thermoplastic elastomer, a polyamide-based thermoplastic elastomer, and a fluorine-based thermoplastic elastomer; foamed plastics; and polyurethanes. Among these, a polyurethane having a foam structure is particularly preferable because flexibility desirable for the cushioning layer can be easily achieved.

The thickness of the cushioning layer is not particularly limited, but is preferably 0.5 to 5 mm, for example. When the cushioning layer is too thin, the effect of following the warpage and the undulations on the entire material to be polished tends to be reduced, resulting in a reduction in the global flatness. On the other hand, when the cushioning layer is too thick, the polishing pad as a whole becomes soft, making it difficult for polishing to be performed in a stable manner. In the case of stacking the cushioning layer on the polishing layer, the thickness of the polishing pad is preferably about 0.3 to 5 mm.

[Polishing Method]

Next, one embodiment of CMP using the polishing pad as described above will be described.

Figure 5:
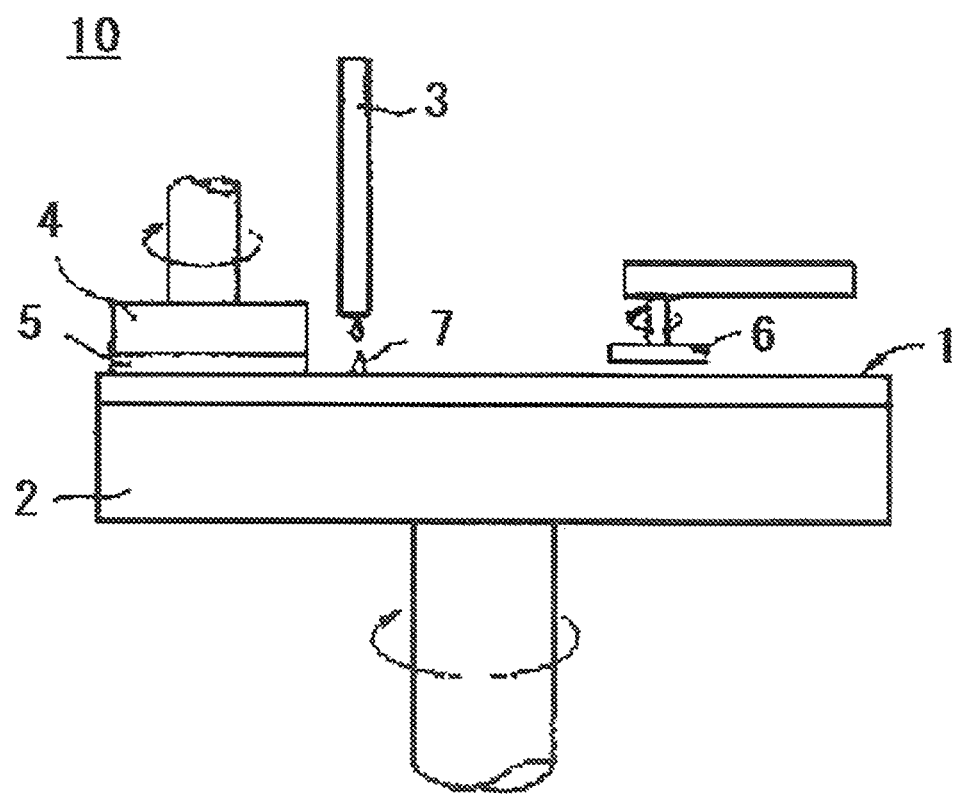
FIG. 5 is an explanatory diagram illustrating a polishing method using a polishing pad according to an embodiment.

In CMP, a CMP apparatus 10 including a circular rotary platen 2, a slurry supply nozzle 3, a carrier 4, and a pad conditioner 6 as shown in FIG. 5 can be used, for example. A polishing pad 1 including the above-described polishing layer is attached to the surface of the rotary platen 2 using double-sided tape or the like. In addition, the carrier 4 supports an object to be polished 5.

In the CMP apparatus 10, the rotary platen 2 is rotated by a motor (not shown) in the direction indicated by the arrow. The carrier 4 is rotated, in the plane of the rotary platen 2, by a motor (not shown), for example, in the direction indicated by the arrow. The pad conditioner 6 is also rotated, in the plane of the rotary platen 2, by a motor (not shown), for example, in the direction indicated by the arrow.

First, while pouring distilled water onto the polishing surface of the polishing pad 1 that is fixed to the rotary platen 2 and is rotated, the CMP pad conditioner 6 in which diamond particles are fixed onto the surface of a carrier by electrodeposition of nickel or the like is pressed against the polishing surface so as to condition the polishing surface of the polishing pad 1. Through conditioning, the polishing surface is adjusted to have a surface roughness suitable for polishing the surface to be polished. Next, a slurry 7 is supplied from the slurry supply nozzle 3 to the polishing surface of the rotating polishing pad 1. In performing CMP, a lubricating oil, a coolant, and the like may be optionally used in combination with the slurry.

Here, used as the slurry, it is preferable to use an acidic slurry for use in CMP that contains, for example, a liquid medium such as water or oil; abrasive grains such as silica, alumina, cerium oxide, zirconium oxide or silicon carbide; a base, an acid, a surfactant, an oxidizing agent such as a hydrogen peroxide solution, a reducing agent, and a chelating agent. Note that an acidic slurry, an alkaline slurry, and a near neutral slurry are available as the slurry; however, in the case of using the polishing layer of the first example described above, it is particularly preferable to use an acidic slurry having a pH of 2.0 to 7.0, in particular, a pH of 3.0 to 6.0, because the high affinity with the slurry can be maintained when performing CMP. When an oxidizing agent is contained in the slurry, even if a polishing layer has an aldehyde group or a hydroxyl group on the surface thereof before polishing, these groups are oxidized into a carboxylic acid group by the oxidizing agent contained in the slurry, so that the zeta potential of the surface of the polishing layer can be made negative at the time of polishing.

Then, the object to be polished 5 that is fixed to the carrier 4 and is rotated is pressed against the polishing pad 1 on which the slurry 7 is evenly spread on the polishing surface of the polishing layer. Then, the polishing treatment is continued until a predetermined flatness is achieved. Adjustment of the pressing force applied during polishing or the speed of relative movement between the rotary platen 2 and the carrier 4 affects the finishing quality.

The polishing conditions are not particularly limited; however, the rotational speed of each of the rotary platen and the carrier is preferably as low as 300 rpm or less in order to efficiently perform polishing, and the pressure applied to the object to be polished is preferably 150 kPa or less in order to prevent a flaw from being caused after polishing. During polishing, it is preferable that the slurry is continuously supplied to the polishing surface using a pump or the like. The amount of the slurry supplied is not particularly limited, but the polishing slurry is preferably supplied such that the polishing surface is constantly covered with the slurry.

Then, after the object to be polished that has undergone polishing is fully washed with running water, it is preferable to dry the object to be polished by removing water droplets attached thereto by using a spin drier or the like. In this manner, a smooth surface can be achieved on the entirety of the surface to be polished as a result of polishing the surface to be polished with the slurry.

Such CMP according to the present embodiment can be preferably used for polishing performed during the production process of various semiconductor devices, MEMS (MicroElectro Mechanical Systems), and the like. The CMP can be preferably used to polish objects to be polished, including, for example, an insulating film such as an oxide film formed on a semiconductor substrate, a wiring metal film of copper, aluminum, tungsten or the like; and a barrier metal film of tantalum, titanium, tantalum nitride, titanium nitride or the like, in particular, an insulating film such as an oxide film. The CPM can also be used to polish a metal film on which a pattern such as a wiring pattern or a dummy pattern is formed. The pitch between lines in the pattern may differ depending on the product, but is usually about 50 nm to 100 μm.

EXAMPLES

An example of each of the Schiff base-containing chain extender, the polyurethane, the polishing layer, the modification method, and the polishing method according to the present invention will be described by way of examples. It should be noted that the scope of the present invention is not to be construed as being limited to the following examples.

Production Example 1

Synthesis of 2,4-dihydroxybenzene-1-iminobutane

A synthesis of 2,4-dihydroxybenzene-1-iminobutane (DBIB) as a Schiff base-containing diol that can be used as the Schiff base-containing chain extender will be described.

The synthesis of DBIB was performed in the following manner, according to the scheme represented in the above-described formula (8).

Into a 300-mL recovery flask containing 210 mL of ethyl acetate, 6.44 g (88 mmol) of N-butylamine and 11.0 g (80 mmol) of 2,4-dihydroxybenzaldehyde were dissolved, and 12.3 mL (88 mmol) of triethylamine was further added thereto. Then, the resulting solution was stirred for one hour while being maintained at 40° C. using an oil bath, to allow the reaction of the above-described scheme to proceed. Then, after completion of the reaction, the crystals that had been precipitated in the ethyl acetate solution were subjected to suction filtration, and thereafter were washed twice with ethyl acetate. Then, the washed crystals were vacuum dried for 7 hours at 70° C., to give 12.5 g of DBIB. The yield was 81%.

Note that the proceeding of the reaction was monitored by tracing the changes of the spot at each Rf value by thin-layer chromatography (TLC) using ethyl acetate as the developing solvent. The spot at an Rf value of 0 that showed no UV absorption and exhibited a purple color with a ninhydrin reagent indicates butylamine, the spot at an Rf value of 0.50 that showed UV absorption and exhibited an yellow color with the ninhydrin reagent indicates DBIB, and the spot at an Rf value of 0.68 that showed UV absorption and exhibited no color with the ninhydrin reagent indicates 2,4-dihydroxybenzaldehyde.

The resulting crystals were identified to be DBIB according to the following peaks in 1H-NMR (400 MHz, solvent: d6-DMSO, reference: TMS): δ (ppm): 0.89-0.93 (CH3, t), 1.29-1.38 (CH2, m), 1.53-1.60 (CH2, m), 3.47-3.50 (CH2, t), 6.11 (CH, s), 6.20-6.23 (CH, d), 7.13-7.15 (CH, d), 8.32 (CH, s), 9.98 (OH, s), 14.0 (OH, S)

The decomposition temperature of the resulting crystals was measured using a differential thermal balance (manufactured by Rigaku Corporation, trade name: TG8120) by elevating the temperature of approximately 3.6 mg of a sample from 30° C. to 500° C. at a temperature rising rate of 10° C./min under a nitrogen atmosphere. The decomposition temperature was 163° C.

Production Example 2

(Synthesis of 4-[(3-dimethylamino-propylimino)-methyl]-benzene-1,3-diol)

A synthesis of 4-[(3-dimethylamino-propylimino)-methyl]-benzene-1,3-diol as a Schiff base-containing diol that can be used as the Schiff base-containing chain extender will be described.

The synthesis of 4-[(3-dimethylamino-propylimino)-methyl]-benzene-1,3-diol was performed in the following manner, according to the scheme represented in the above-described formula (9).

Into a 300-mL recovery flask containing 160 mL of ethyl acetate, 2.25 g (22 mmol) of N,N-dimethyl-1,3-propane diamine and 2.76 g (20 mmol) of 2,4-dihydroxybenzaldehyde were dissolved, and 3.06 mL (22 mmol) of triethylamine was further added thereto. Then, the resulting solution was stirred for one hour while being maintained at 40° C. using an oil bath, to allow the reaction of the above-described scheme to proceed. Then, after completion of the reaction, the ethyl acetate solvent was removed by distillation under a reduced pressure, and was purified by column chromatography using methanol as the developing solvent. Then, the resulting product was vacuum dried for 7 hours at 70° C., to give 3.25 g of 4-[(3-dimethylamino-propylimino)-methyl]-benzene-1,3-diol. The yield was 73%.

Note that the proceeding of the reaction was monitored by tracing the changes of the spot at each Rf value by thin-layer chromatography (TLC) using methanol as the developing solvent. The spot at an Rf value of 0.03 that showed no UV absorption and exhibited a purple color with a ninhydrin reagent indicates N,N-dimethyl-1,3-propane diamine, the spot at an Rf value of 0.21 that showed UV absorption and exhibited an yellow color with the ninhydrin reagent indicates 4-[(3-dimethylamino-propylimino)-methyl]-benzene-1,3-diol, and the spot at an Rf value of 0.80 that showed UV absorption and exhibited no color with the ninhydrin reagent indicates 2,4-dihydroxybenzaldehyde.

The resulting crystals were identified to be 4-[(3-dimethylamino-propylimino)-methyl]-benzene-1,3-diol according to the following peaks in 1H-NMR (400 MHz, solvent: d6-DMSO, reference: TMS): δ (ppm): 1.67-1.75 (CH3, m), 2.16-2.22 (CH2, m), 2.24-2.26 (CH2, m), 3.49-3.52 (CH2, t), 6.12 (CH, s), 6.21-6.24 (CH, d), 7.15-7.17 (CH, d), 8.32 (CH, s), 13.9 (OH, S)

The decomposition temperature of the resulting crystals was measured using a differential thermal balance (manufactured by Rigaku Corporation, trade name: TG8120) by elevating the temperature of approximately 1.3 mg of a sample from 30° C. to 500° C. at a temperature rising rate of 10° C./min under a nitrogen atmosphere. The decomposition temperature was 169° C.

Example 1

Polytetramethylene glycol having a number-average molecular weight of 850 (PTG850), DBIB obtained in Production Example 1, 1,5-pentane diol (PD), and 4,4'-diphenyl methane diisocyanate (MDI) were used in such a proportion that the mass ratio of PTG850:DBIB:PD:MDI was 23.6:7.2:15.5:53.6 (the molar ratio between DBIB and PD was 20/80), and the whole was continuously supplied into a coaxially rotating twin-screw extruder using a metering pump, and was subjected to continuous melt-polymerization, to produce a thermoplastic polyurethane having a Schiff base. The produced thermoplastic polyurethane melt was continuously extruded in a strand form into water, and was thereafter finely cut into pellets with a pelletizer, and the resulting pellets were dehumidified/dried for 20 hours at 80° C., to produce a thermoplastic polyurethane (PU1).

(Production of Molded Sheet of Polyurethane Having Schiff Base, and Surface Modification of Molded Sheet)

Using a hot pressing machine, the PU1 pellets (5 to 14 g) sandwiched between Teflon (registered trademark) sheets were molded by being pressed at 200 to 230° C., to mold a 0.3 to 0.5 mm-thick molded sheet of a polyurethane having a Schiff base. Then, the molded sheet of a polyurethane having a Schiff base was subjected to an acid treatment by being immersed in an aqueous dilute sulfuric acid (10 mass %) solution with 40° C. and a pH of 1.75 for four days. Thus, the Schiff base retained in the polyurethane molded sheet was cleaved to liberate the butylamine as shown in FIG. 1, to cause the molded sheet to retain the aldehyde group. Note that the cleavage ratio of the Schiff base of the molded sheet of a polyurethane having an aldehyde group was checked as follows.

The dilute sulfuric acid that had been neutralized by the butylamine liberated by the cleavage of the Schiff base was subjected to neutralization titration in a 0.05 M aqueous KOH solution, and then was quantitatively determined. In addition, to correct the concentration change of the aqueous dilute sulfuric acid solution due to evaporation, only an aqueous dilute sulfuric acid solution under the same conditions was subjected to neutralization titration in the same manner as a background (BG). Then, the amount of the liberated butylamine was calculated according to the following formulas (11) and (12), to calculate the cleavage ratio of the Schiff base on the surface layer. The cleavage ratio of the Schiff base on the surface layer of the molded sheet due to the acid treatment was approximately 20%.

$$\text{Amount of residual dilute sulfuric acid [mol]} = \{\text{KOH concentration } 5\times10^{-5} \text{ [mol/ml]} \times \text{Titer A [mL]} \times (\text{Factor of 0.05 KMnO}_4) \times \text{Dilution ratio) [wt \%]} \times (\text{Collected amount) [wt \%]}\} \div 2 \text{ (Valence of H}_2\text{SO}_4) \quad (11)$$

$$\text{Amount of liberated amine [mol]} = \text{Amount of dilute sulfuric acid reduced } (=(\text{BG-Incl. sample}))\times 2 \quad (12)$$

Then, the aldehyde group retained in the polyurethane was oxidized, to obtain a molded sheet having a carboxylic acid group. Specifically, the aldehyde group retained in the polyurethane was oxidized by immersing the molded sheet of a polyurethane having an aldehyde group in a 5.0 wt % hydrogen peroxide solution that had been adjusted to a pH of 9.0 with a 2M aqueous NaOH solution. In this manner, a molded sheet of a polyurethane having a carboxylic acid group was obtained. Then, the amount of the hydrogen peroxide consumed for the oxidation of the aldehyde group retained in the polyurethane was determined by quantitatively determinizing the residual amount of the hydrogen peroxide in the reaction solution. Specifically, the reacted hydrogen peroxide solution was subjected to neutralization titration using a 0.02 M aqueous $KMnO_4$ solution (factor=0.999). In addition, to correct the influence by the amount reduced by the decomposition of the hydrogen peroxide, a 5.0 wt % hydrogen peroxide solution that had been adjusted to a pH of 9.0 with a 2 M aqueous NaOH solution was also subjected to neutralization titration in the same manner as a background (BG). Then, the residual amount of the hydrogen peroxide was determined according to the following formula (13). Then, the concentration ratio of the hydrogen peroxide that had been reduced by the oxidation was determined as an oxidation ratio. The oxidation ratio of the aldehyde group on the surface layer of the molded sheet was approximately 90%.

$$\text{Residual H}_2\text{O}_2 \text{ [g]} = (\text{Amount of H}_2\text{O}_2 \text{ reacting with 1 mL of 0.02 M KMnO}_4) \text{ [g/mL]} \times (\text{Titer A}) \text{ [mL]} \times (\text{Factor of 0.02 M KMnO}_4) \times (\text{Dilution ratio}) \text{ [wt \%]} \times (\text{Collected amount}) \text{ [wt \%]} \quad (13)$$

Then, the properties of the molded sheet of a polyurethane having a carboxylic acid group were evaluated in the following manner.

(Measurement of Zeta Potential)

The surface of the molded sheet of a polyurethane having a carboxylic acid group that had been cut out into 30 mm×60 mm was washed. Then, using an electrophoretic light scattering device (ELS-Z, manufactured by Otsuka Electronics Co., Ltd.), the sample was attached to a plate measurement cell, and measurement was carried out using monitor latices (manufactured by Otsuka Electronics Co., Ltd.) dispersed in 10 mM aqueous NaCl solutions that had been adjusted to a pH of 3.0 and a pH of 4.0, respectively, with an aqueous HCl solution. Similarly, measurement was also carried out using a monitor latex dispersed in a 10 mM aqueous NaCl solution that had been adjusted to a pH of 8.0 with an aqueous NaOH solution. In addition, the zeta potential of a molded sheet obtained without performing the acid treatment step and the oxidation step was also measured for the Pill molded sheet of Example 1 as a representative example.

(Affinity for Slurry (Initial Gradient in Affinity with Abrasive Grains))

The affinity with the slurry was evaluated for the molded sheet of a polyurethane having a carboxylic acid group by using an inter-molecular interaction measurement device QCM-D manufactured by Q-Sense. The sample used was obtained by coating a polyurethane resin on a gold sensor by using a spin coater MS-A100 manufactured by Mikasa Co. Ltd. The measurement was carried out at a flow velocity of 50 μl/min, a slurry concentration of 1 wt % (in water), and a measurement temperature of 30° C., under the conditions: pH=3.0, 3.5, 5.5, and 9.0. The initial gradient at the start of absorption was calculated on a graph representing the relationship between the adsorption time and the absorption amount, and the calculated value was used as the indicator of the affinity between the slurry and the sample.
(Contact Angle with Water)

A film of PU1 having a thickness of 300 μm was produced by hot pressing. Then, a modification treatment was performed in the above-described manner, to obtain a film of a polyurethane having a carboxylic acid group. The obtained film was allowed to stand for 3 days under the conditions: 20° C. and 65% RH, and subsequently the contact angle with water of the film was measured using a DropMaster 500 manufactured by Kyowa Interface Science Co., Ltd.
(Storage Modulus at 50° C. after Swollen to Saturation with Water at 50° C.)

An injection-molded sheet of PU-1 having a width of 5 mm, a length of 30 mm, and a thickness of 2 mm was produced. Then, a modification treatment was performed in the above-described manner, to obtain a molded article of a polyurethane having a carboxylic acid group. Then, the injection-molded sheet was immersed in water at 50° C. for 3 days. Then, after the water on the surface of the injection-molded sheet that had been taken out from the water was wiped off, the dynamic viscoelastic modulus at 50° C. was measured at a frequency of 11 Hz using a dynamic viscoelasticity measurement device ("DVE Rheospectoler", manufactured by Rheology Co. Ltd.), to determine the storage modulus.

The results of the above-described evaluations are collectively shown in Tables 1 and 2 below. Note that Table 2 also shows the zeta potential at each of the pHs of the PU1 molded sheet of Example 1 before the acid treatment and the oxidation, and after the acid treatment and the oxidation.

TABLE 2

| Sample state | Before acid treatment and oxidation | After acid treatment and oxidation |
|---|---|---|
| Zeta potential at pH of 8.0 [mV] | −7.74 | −24.7 |
| Zeta potential at pH of 4.0 [mV] | 3.04 | −10.2 |
| Zeta potential at pH of 3.0 [mV] | 4.22 | −7.70 |

Example 2

Polytetramethylene glycol having a number-average molecular weight of 650 (PTG650), DBIB, PD, and MDI were used in such a proportion that the mass ratio of PTG650:DBIB:PD:MDI was 20.9:14.1:11.4:53.6 (the molar ratio between DBIB and PD was 40/60), and the whole was continuously supplied into a coaxially rotating twin-screw extruder using a metering pump, and was subjected to continuous melt-polymerization, to produce a thermoplastic polyurethane. The produced thermoplastic polyurethane melt was continuously extruded in a strand form into water, and was thereafter finely cut into pellets with a pelletizer, and the resulting pellets were dehumidified/dried for 20 hours at 80° C., to produce a thermoplastic polyurethane (PU2). Then, evaluations were made in the same manner except that PU2 was used in place of PU1. The results are shown in Table 1.

Example 3

PTG850, DBIB, 1,4-butane diol (BD), and MDI were used in such a proportion that the mass ratio of PTG850:

TABLE 1

| | | Example No. | | | | | | | | | |
|---|---|---|---|---|---|---|---|---|---|---|---|
| | | Ex. 1 | Ex. 2 | Ex. 3 | Ex. 4 | Com Ex. 1 | Com Ex. 2 | Com Ex. 3 | Com Ex. 4 | Com Ex. 5 | Com Ex. 6 |
| Chain extender | | PD | PD | BD | BD | BD/MPD | BD | BD | BD/PD | BD/MPD | BD/MPD |
| Molar ratio of chain extender other than Schiff base-containing chain extender | | — | — | — | — | 75/25 | — | — | 25/75 | 70/30 | 70/30 |
| Chain extender including Schiff base | Type | DBIB | DBIB | DBIB | BSED | — | — | — | — | — | — |
| | Mass % | 20 | 40 | 20 | 30 | — | — | — | — | — | — |
| Polymer polyol | Type | PTG 850 | PTB 650 | PTG 850 | PTG 850 | PTG 850 | PTG 850 | PTG850/ PEG600 | PCD 2000 | PTG 850 | PEG 600 |
| | Molar ratio | — | — | — | — | — | — | 60/40 | | | |
| Content of nitrogen atoms derived from isocyanate group (mass %) | | 6.0 | 6.0 | 6.0 | 6.0 | 6.5 | 5.5 | 5.5 | 6.5 | 7.0 | 7.0 |
| | | Zeta potential (mV) | | | | | | | | | |
| pH. 8.0 | | −24.7 | −14.6 | −15.4 | −22.7 | −13.6 | −14.9 | −11.9 | −12.5 | −25.4 | −22.1 |
| pH. 4.0 | | −10.2 | −7.8 | −10.8 | −5.5 | −7.1 | −8.7 | −5.1 | −4.9 | −2.8 | −4.3 |
| pH. 3.0 | | −7.70 | −3.10 | −6.80 | −2.50 | 0.60 | −0.03 | −0.77 | −0.11 | 0.70 | −0.20 |
| Storage modulus after swollen to saturation with water at 50° C. (Mpa) | | 468 | 214 | 646 | 304 | 783 | 284 | 193 | 1160 | 1430 | 1370 |
| Contact angle with water (degrees) | | 60 | 60 | 61 | 60 | 69 | 70 | 67 | 70 | 72 | 70 |
| Initial gradient in affinity with abrasive grains (ng/cm² · min) | | 4756 | 2085 | 4207 | 1741 | 1057 | 324 | 608 | 715 | 44 | 9.4 |

DBIB:BD:MDI was 26.0:7.1:13.2:53.6 (the molar ratio between DBIB and BD was 20/80), and the whole was continuously supplied into a coaxially rotating twin-screw extruder using a metering pump, and was subjected to continuous melt-polymerization, to produce a thermoplastic polyurethane. The produced thermoplastic polyurethane melt was continuously extruded in a strand form into water, and was thereafter finely cut into pellets with a pelletizer, and the resulting pellets were dehumidified/dried for 20 hours at 80° C., to produce a thermoplastic polyurethane (PU3). Then, evaluations were made in the same manner except that PU3 was used in place of PU1. The results are shown in Table 1.

Example 4

PTG850, N,N'-bis(salicylidene)ethylenediamine (BSED), BD, and MDI were used in such a proportion that the mass ratio of PTG850:BSED:BD:MDI was 10.4:17.7:13.9:58.1 (the molar ratio between BSED and BD was 30/70), and the whole was continuously supplied into a coaxially rotating twin-screw extruder using a metering pump, and was subjected to continuous melt-polymerization, to produce a thermoplastic polyurethane. The produced thermoplastic polyurethane melt was continuously extruded in a strand form into water, and was thereafter finely cut into pellets with a pelletizer, and the resulting pellets were dehumidified/dried for 20 hours at 80° C., to produce a thermoplastic polyurethane (PU4). Then, evaluations were made in the same manner except that PU4 was used in place of PU1. The results are shown in Table 1.

Comparative Example 1

PTG850, BD, methyl pentane diol (MPD), and MDI were used in such a proportion that the mass ratio of PTG850:BD:MPD:MDI was 19.0:14.7:6.4:59.9, and the whole was continuously supplied into a coaxially rotating twin-screw extruder using a metering pump, and was subjected to continuous melt-polymerization, to produce a thermoplastic polyurethane. The produced thermoplastic polyurethane melt was continuously extruded in a strand form into water, and was thereafter finely cut into pellets with a pelletizer, and the resulting pellets were dehumidified/dried for 20 hours at 80° C., to produce a thermoplastic polyurethane (PU11). Then, evaluations were made in the same manner except that PU11 was used in place of PU1. Note that PU11 does not have a Schiff base, and thus does not be modified even when it is subjected to a treatment under an acidic condition, or an oxidation treatment. The results are shown in Table 1.

Comparative Example 2

PTG850, BD, and MDI were used in such a proportion that the mass ratio of PTG850:BD:MDI was 46.7:7.4:45.9, and the whole was continuously supplied into a coaxially rotating twin-screw extruder using a metering pump, and was subjected to continuous melt-polymerization, to produce a thermoplastic polyurethane. The produced thermoplastic polyurethane melt was continuously extruded in a strand form into water, and was thereafter finely cut into pellets with a pelletizer, and the resulting pellets were dehumidified/dried for 20 hours at 80° C., to produce a thermoplastic polyurethane (PU12). Then, evaluations were made in the same manner except that PU12 was used in place of PU1. Note that PU12 does not have a Schiff base, and thus does not be modified even when it is subjected to a treatment under an acidic condition, or an oxidation treatment. The results are shown in Table 1.

Comparative Example 3

Polyethylene glycol having a number-average molecular weight of 600 (PEG600), PTG850, BD, and MDI were used in such a proportion that the mass ratio of PEG600:PTG850:BD:MDI was 17.4:16.4:14.3:51.9, and the whole was continuously supplied into a coaxially rotating twin-screw extruder using a metering pump, and was subjected to continuous melt-polymerization, to produce a thermoplastic polyurethane. The produced thermoplastic polyurethane melt was continuously extruded in a strand form into water, and was thereafter finely cut into pellets with a pelletizer, and the resulting pellets were dehumidified/dried for 20 hours at 80° C., to produce a thermoplastic polyurethane (PU13). Then, evaluations were made in the same manner except that PU13 was used in place of PU1. Note that PU13 does not have a Schiff base, and thus does not be modified even when it is subjected to a treatment under an acidic condition, or an oxidation treatment. The results are shown in Table 1.

Comparative Example 4

Polycarbonate diol having a number-average molecular weight of 2000 (PCD2000), BD, PD, and MDI were used in such a proportion that the mass ratio of PCD2000:BD:PD:MDI was 19.5:5.0:17.4:58.1, and the whole was continuously supplied into a coaxially rotating twin-screw extruder using a metering pump, and was subjected to continuous melt-polymerization, to produce a thermoplastic polyurethane. The produced thermoplastic polyurethane melt was continuously extruded in a strand form into water, and was thereafter finely cut into pellets with a pelletizer, and the resulting pellets were dehumidified/dried for 20 hours at 80° C., to produce a thermoplastic polyurethane (PU14). Then, evaluations were made in the same manner except that PU14 was used in place of PU1. Note that PU14 does not have a Schiff base, and thus does not be modified even when it is subjected to a treatment under an acidic condition, or an oxidation treatment. The results are shown in Table 1.

Comparative Example 5

PTG850, BD, MPD, and MDI were used in such a proportion that the mass ratio of PTG850:BD:MPD:MDI was 10.3:15.7:8.8:65.2, and the whole was continuously supplied into a coaxially rotating twin-screw extruder using a metering pump, and was subjected to continuous melt-polymerization, to produce a thermoplastic polyurethane. The produced thermoplastic polyurethane melt was continuously extruded in a strand form into water, and was thereafter finely cut into pellets with a pelletizer, and the resulting pellets were dehumidified/dried for 20 hours at 80° C., to produce a thermoplastic polyurethane (PU15). Then, evaluations were made in the same manner except that PU15 was used in place of PU1. Note that PU15 does not have a Schiff base, and thus does not be modified even when it is subjected to a treatment under an acidic condition, or an oxidation treatment. The results are shown in Table 1.

Comparative Example 6

PEG600, BD, MPD, and MDI were used in such a proportion that the mass ratio of PEG600:BD:MPD:MDI was 10.8:15.3:8.6:65.3, and the whole was continuously supplied into a coaxially rotating twin-screw extruder using a metering pump, and was subjected to continuous melt-polymerization, to produce a thermoplastic polyurethane. The produced thermoplastic polyurethane melt was continuously extruded in a strand form into water, and was thereafter finely cut into pellets with a pelletizer, and the resulting pellets were dehumidified/dried for 20 hours at 80° C., to produce a thermoplastic polyurethane (referred to as PU16). Then, evaluations were made in the same manner except that PU16 was used in place of PU1. Note that PU16 does not have a Schiff base, and thus does not be modified even when it is subjected to a treatment under an acidic condition, or an oxidation treatment. The results are shown in Table 1.

(Evaluation of Polishing Pad)

Polishing layers were produced by using the polyurethane PU1 to PU4 and PU11 to PU16 obtained in Examples 1 to 4 and Comparative Examples 1 to 6, and polishing pads respectively including these polishing layers were evaluated.

[Polishing Performance]

The pellets of each of PU1 to PU4 and PU11 to PU16 were supplied to a single-screw extrusion molder, and were extruded from a T-die, to mold a sheet having a thickness of 2.0 mm. Then, after the surface of each of the obtained sheets was ground to give a sheet having a uniform thickness of 1.5 mm, grooves having a width of 1.0 mm and a depth of 1.0 mm were formed concentrically at an interval of 6.5 mm on the surface, to produce a circular polishing pad having a diameter of 380 mm. Then, each of the polishing pads was processed under the same conditions as the processing conditions employed in "Production of Molded Sheet of Polyurethane having Schiff Base, and Surface Modification of Molded Sheet" above. Then, each of the obtained polishing pads was attached to a polishing device "MAT-BC15" manufactured by MAT Inc. Then, while pouring distilled water at a rate of 150 mL/min, the surface of the pad was conditioned using a diamond dresser manufactured by A.L.M.T. CoLp. (#100, coverage: 80%, diameter: 19 cm, mass: 1 kg), under the conditions: a dresser rotation rate of 140 rpm, a platen rotation rate of 100 rpm, and for 1 hour. Next, a slurry having a pH of 4.0 that had been adjusted by diluting a stock solution of the slurry two-fold was prepared. Then, while supplying the slurry onto the polishing surface of the polishing pad at a rate of 120 mL/min, a 4-inch-diameter silicon wafer having a silicon oxide film with a thickness of 1000 nm on the surface thereof was polished for 60 seconds using the polishing pad under the conditions: a platen rotation rate of 100 rpm, a head rotation rate of 99 rpm, and a polishing pressure of 27.6 kPa. Then, after being polished for 60 seconds, the polishing pad was conditioned for 30 seconds. Then, another silicon wafer was polished with the polishing pad, and the polishing pad was further conditioned for 30 seconds. In this manner, 10 silicon wafers were polished.

Then, the thicknesses before and after polishing of the silicon oxide film on the tenth silicon wafer that had been polished were measured at 49 points in the wafer plane, and the polishing rate at each of the points was determined. Specifically, the average value of the polishing rates at the 49 points was used as a polishing rate.

The results of the above-described evaluations are collectively shown in Table 3. Note that the polishing rates of PU1 to PU4 are estimated values calculated in the following manner.

(Method for Calculating Estimated Value)

Based on the known data on the relationship between the initial gradient in affinity of each of the polyurethanes respectively including PU11 to PU16 and the abrasive grains, an approximate expression represented by the following formula (14) was calculated. Then, the initial gradient in affinity in each of the examples of PU1 to PU4 was substituted for X in the formula (14), to calculate an estimated value, which is the value of Y, of the polishing rate.

$$Y=0.1658*X+368.36 \tag{14}$$

TABLE 3

| | Example No. | | | | | | | | | |
|---|---|---|---|---|---|---|---|---|---|---|
| | Ex. 1 | Ex. 2 | Ex. 3 | Ex. 4 | Com Ex. 1 | Com Ex. 2 | Com Ex. 3 | Com Ex. 4 | Com Ex. 5 | Com Ex. 6 |
| Zeta potential at pH of 8.0 [mV] | −24.7 | −14.6 | −15.4 | −22.7 | −13.6 | −14.9 | −11.9 | −12.5 | −25.4 | −22.1 |
| Zeta potential at pH of 4.0 [mV] | −10.2 | −7.8 | −10.8 | −5.5 | −7.1 | −8.7 | −5.1 | −4.9 | −2.8 | −4.3 |
| Zeta potential at pH of 3.0 [mV] | −7.70 | −3.10 | −6.80 | −2.50 | 0.60 | −0.03 | −0.77 | −0.11 | 0.70 | −0.20 |
| Initial gradient in affinity with abrasive grains [ng/cm$^2$ · min] | 4756 | 2085 | 4207 | 1741 | 1057 | 324 | 608 | 715 | 44 | 9.4 |
| Polishing rate [nm/min] | 1156 | 714 | 1066 | 657 | 883 | 370 | 501 | 462 | 110 | 368 |

From the results shown in Table 3, it can be seen that the polishing pads obtained in Examples 1 to 4, in which the zeta potential at a pH of 3.0 was in the range of −1.0 mV or less, were able to achieve high affinity even when an acidic slurry having a pH of 3.0 was used. On the other hand, the polishing pads obtained in Comparative Examples 1 to 6, in which the zeta potential at a pH of 3.0 exceeded −1.0 mV, were not able to achieve high affinity. From Table 3, it can also be seen that the higher the initial gradient in affinity, the higher the polishing rate becomes.

Production Example 3

(Synthesis of 3-[{4-[(3-hydroxy-propylimino)-methyl]-benzylidene}-amino]-propane-1-ol)

A synthesis of 3-[{4-[(3-hydroxy-propylimino)-methyl]-benzylidene}-amino]-propane-1-ol as a Schiff base-containing diol that can be used as the Schiff base-containing chain extender will be described.

The synthesis of 3-[{4-[(3-hydroxy-propylimino)-methyl]-benzylidene}-amino]-propane-1-ol was performed in the following manner, according to the scheme represented in the above-described formula (10).

Into a 300-mL recovery flask containing 100 mL of ethyl acetate, 4.02 g (30 mmol) of terephthalaldehyde and 6.75 g (90 mmol) of 3-amino-1-propanol were dissolved, and 12.5 mL (90 mmol) of triethylamine was further added thereto. Then, the resulting solution was stirred for five hours while being maintained at 40° C. using an oil bath, to allow the reaction of the above-described scheme to proceed. Then, after completion of the reaction, the solution was washed with an aqueous NaCl solution that had been adjusted to a pH of 7.0, and was purified by column chromatography using ethyl acetate as the developing solvent. Then, the resulting product was vacuum dried for 7 hours at 70° C., to give 4.93 g of 3-[{4-[(3-hydroxy-propylimino)-methyl]-benzylidene}-amino]-propane-1-ol. The yield was 66%.

Note that the proceeding of the reaction was monitored by tracing the changes of the spot at each Rf value by thin-layer chromatography (TLC) using ethyl acetate as the developing solvent. The spot at an Rf value of 0 that showed no UV absorption and exhibited a purple color with a ninhydrin reagent indicates 3-amino-1-propanol, the spot at an Rf value of 0.20 that showed UV absorption and exhibited a red color with the ninhydrin reagent indicates 3-[{4-[(3-hydroxy-propylimino)-methyl]-benzylidene}-amino]-propane-1-ol, and the spot at an Rf value of 0.63 that showed UV absorption and exhibited no color with the ninhydrin reagent indicates terephthalaldehyde.

The resulting crystals were identified to be DBIB according to the following peaks in 1H-NMR (400 MHz, solvent: d6-DMSO, reference: TMS): δ (ppm): 1.74-1.80 (CH2, m), 3.46-3.50 (CH2, t), 3.61-3.65 (CH2, t), 4.47 (CH, s), 7.87-7.89 (CH, d), 8.38-8.46 (CH, d), 10.1 (OH, s)

The decomposition temperature of the resulting crystals was measured using a differential thermal balance (manufactured by Rigaku Corporation, trade name: TG8120) by elevating the temperature of approximately 1.7 mg of a sample from 30° C. to 500° C. at a temperature rising rate of 10° C./min under a nitrogen atmosphere. The decomposition temperature was 228° C.

Example 5

Polytetramethylene glycol having a number-average molecular weight of 850 (PTG850), 3-[{4-[(3-hydroxy-propylimino)-methyl]-benzylidene}-amino]-propane-1-ol obtained in Production Example 3, 1,4-butane diol (BD), and 4,4'-diphenyl methane diisocyanate (MDI) were used in such a proportion that the mass ratio of PTG850:3-[{4-[(3-hydroxy-propylimino)-methyl]-benzylidene}-amino]-propane-1-ol:BD:MDI was 31.5:7.9:11.5:49.1 (the molar ratio between 3-[{4-[(3-hydroxy-propylimino)-methyl]-benzylidene}-amino]-propane-1-ol and BD was 20/80), and the whole was continuously supplied into a coaxially rotating twin-screw extruder using a metering pump, and was subjected to continuous melt-polymerization, to produce a thermoplastic polyurethane having a Schiff base. The produced thermoplastic polyurethane melt was continuously extruded in a strand form into water, and was thereafter finely cut into pellets with a pelletizer, and the resulting pellets were dehumidified/dried for 20 hours at 80° C., to produce a thermoplastic polyurethane (PU5).

(Production of Molded Sheet of Polyurethane Having Schiff Base, and Surface Modification of Molded Sheet)

Using a hot pressing machine, the pellets (5 to 14 g) of PU5 sandwiched between Teflon sheets were molded by being pressed at 200 to 230° C., to mold a 0.3 to 0.5 mm-thick molded sheet. Then, the obtained molded sheet was subjected to an acid treatment by being immersed in an aqueous dilute sulfuric acid (10 mass %) solution with 50° C. and a pH of 1.75 for two days. Thus, the Schiff base on the surface layer of the molded sheet was cleaved to liberate the terephthalaldehyde as shown in FIG. 4, to obtain a molded sheet of a polyurethane having an amino group.

Then, the properties of the molded sheet of a polyurethane having an amino group were evaluated in the following manner.

(Measurement of Zeta Potential)

The surface of the molded sheet that had been cut out into 30 mm×60 mm was washed. Then, using an electrophoretic light scattering device (ELS-Z, manufactured by Otsuka Electronics Co., Ltd.), the sample was attached to a plate measurement cell, and measurement was carried out using a monitor latex (manufactured by Otsuka Electronics Co., Ltd.) dispersed in a 10 mM aqueous NaCl solution that had been adjusted to a pH of 3.0 with an aqueous HCl solution. Similarly, measurement was also carried out using a monitor latex dispersed in a 10 mM aqueous NaCl solution that had been adjusted to a pH of 5.0 with an aqueous HCl solution and an aqueous NaOH solution. Similarly, measurement was also carried out using a monitor latex dispersed in a 10 mM aqueous NaCl solution that had been adjusted to a pH of 8.0 with an aqueous NaOH solution. For comparison, the zeta potential of a molded sheet obtained without performing the acid treatment was also measured.

The results of the above-described evaluations are collectively shown in Table 4.

TABLE 4

| Sample state | Before acid treatment | After acid treatment |
|---|---|---|
| Zeta potential at pH of 8.0 [mV] | −14.2 | 7.38 |
| Zeta potential at pH of 5.0 [mV] | 2.43 | 22.1 |
| Zeta potential at pH of 3.0 [mV] | 5.66 | 19.9 |

A polyurethane having an amino group can be obtained by subjecting PU5 to an acid treatment as shown in FIG. 4. As shown in Table 4, such a polyurethane having an amino group has a high zeta potential at each of the pHs. It is preferable to use a polishing layer containing such a polyurethane having an amino group on the surface thereof because it is possible to obtain a polishing layer that has a positive zeta potential and exhibits high affinity for abrasive grains having a negative zeta potential in a basic region as well.

(Production of Non-Woven Fabric Sheet Containing Polyurethane Having Schiff Base, and Surface Modification of Non-Woven Fabric Sheet)

Pellets PU1 produced in the same manner as in Example 1 were prepared. Then, the pellets PU1 were subjected to the same surface modification treatment as that performed in Example 1 to produce pellets of a polyurethane having a carboxylic acid. The pellets were dissolved in DMF to prepare a polyurethane solution (concentration: 13 mass %). Then, the polyurethane solution was impregnated into the non-woven fabric by a dip-nipping treatment, and was solidified, to produce a non-woven fabric sheet containing a polyurethane having a Schiff base. Note that a non-woven fabric made of a polyester resin was used as the non-woven fabric. The thus obtained non-woven fabric sheet contained 20 mass % of polyurethane, and had an apparent density of 0.40 g/cm³. For comparison, a non-woven fabric sheet was produced in the same manner by using PI1 obtained without performing the surface treatment.

Then, the zeta potential of the non-woven fabric sheet at each of the pHs was measured in the same manner as in the above-described method.

The results of the above-described measurement are shown in Table 5 below.

TABLE 5

| Sample state | Before acid treatment and oxidation | After acid treatment and oxidation |
| --- | --- | --- |
| Zeta potential at pH of 8.0 [mV] | −7.74 | −26.1 |
| Zeta potential at pH of 4.0 [mV] | 3.04 | −11.2 |
| Zeta potential at pH of 3.0 [mV] | 4.22 | −5.54 |

REFERENCE SIGNS LIST

1 .... Polishing pad
2 .... Rotary platen
3 ... Slurry supply nozzle
4 .... Carrier
5 .... Object to be polished
6 .... Pad conditioner
7 ... Slurry
10 .... CMP apparatus

The invention claimed is:

1. A modification method of a polishing layer including a polyurethane, the method comprising:
    preparing a polishing layer including a polyurethane having a Schiff base; and
    converting the Schiff base into at least one functional group selected from the group consisting of an aldehyde group, a carboxylic acid group, a hydroxyl group, and an amino group.

* * * * *